(12) United States Patent
Sakamoto

(10) Patent No.: US 12,035,481 B2
(45) Date of Patent: Jul. 9, 2024

(54) CIRCUIT BOARD, LIGHT EMITTING DEVICE, AND MANUFACTURING METHOD THEREOF

(71) Applicant: NICHIA CORPORATION, Anan (JP)

(72) Inventor: Masakazu Sakamoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 171 days.

(21) Appl. No.: 17/878,288

(22) Filed: Aug. 1, 2022

(65) Prior Publication Data

US 2023/0040493 A1    Feb. 9, 2023

(30) Foreign Application Priority Data

Aug. 6, 2021  (JP) ................. 2021-129820

(51) Int. Cl.
  *H05K 3/06* (2006.01)
  *H05K 1/05* (2006.01)
  *H05K 1/18* (2006.01)
  *H05K 3/46* (2006.01)

(52) U.S. Cl.
  CPC ............ *H05K 3/06* (2013.01); *H05K 1/05* (2013.01); *H05K 1/181* (2013.01); *H05K 3/4644* (2013.01); *H05K 2201/10113* (2013.01)

(58) Field of Classification Search
  CPC .......... H05K 3/06; H05K 1/05; H05K 3/4644; H05K 1/181; H05K 2201/10113
  See application file for complete search history.

(56) References Cited

U.S. PATENT DOCUMENTS

| | | | | |
|---|---|---|---|---|
| 7,690,817 B2* | 4/2010 | Sanpei | ............... | H05K 1/0203 362/267 |
| 8,062,912 B2* | 11/2011 | Wang | ................. | H05K 1/0204 438/22 |
| 8,698,186 B2* | 4/2014 | Nguyen | ............ | H05K 1/0203 438/22 |
| 9,018,667 B2* | 4/2015 | Lin | .................... | H05K 1/0204 257/99 |
| 2010/0181594 A1* | 7/2010 | Lin | .................... | H01L 21/486 257/E33.056 |
| 2012/0279760 A1 | 11/2012 | Sun | | |

(Continued)

FOREIGN PATENT DOCUMENTS

| | | |
|---|---|---|
| JP | 2002-299515 A | 10/2002 |
| JP | 2003-179316 A | 6/2003 |

(Continued)

*Primary Examiner* — Sherman Ng
(74) *Attorney, Agent, or Firm* — Foley & Lardner LLP

(57) ABSTRACT

A method for manufacturing a circuit board includes: preparing a first substrate and a second substrate, wherein: the first substrate comprises a convex post member formed at a top surface of the first substrate, and the second substrate including a first surface and a second surface opposite to the first surface, and comprising: a first metal layer formed on at least the first surface, and an opening through which a top surface of the post member is uncovered in a plan view; bonding at least a portion of a top surface of the first substrate excluding the post member and the second surface of the second substrate so that the top surface of the post member is uncovered through the opening; and forming a circuit pattern by removing a first portion of the first metal layer.

22 Claims, 22 Drawing Sheets

(56) References Cited

U.S. PATENT DOCUMENTS

| | | |
|---|---|---|
| 2015/0369467 A1 | 12/2015 | Saito et al. |
| 2017/0318661 A1 | 11/2017 | Matsunaga |
| 2021/0160997 A1 | 5/2021 | Kirkpatrick et al. |

FOREIGN PATENT DOCUMENTS

| | | |
|---|---|---|
| JP | 2008-235378 A | 10/2008 |
| JP | 2009-043986 A | 2/2009 |
| JP | 2009-088116 A | 4/2009 |
| JP | 2009-239109 A | 10/2009 |
| JP | 2012-235089 A | 11/2012 |
| JP | 2014-120529 A | 6/2014 |
| JP | 2017-073513 A | 4/2017 |
| JP | 2017-201645 A | 11/2017 |
| WO | WO-2015/059967 A1 | 4/2015 |

* cited by examiner

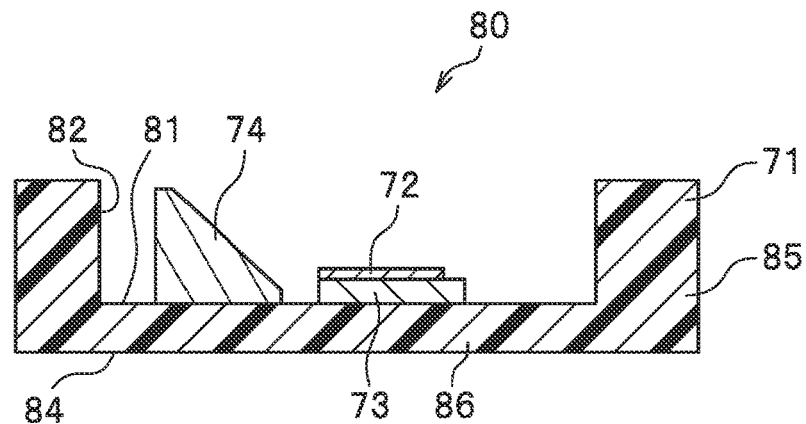
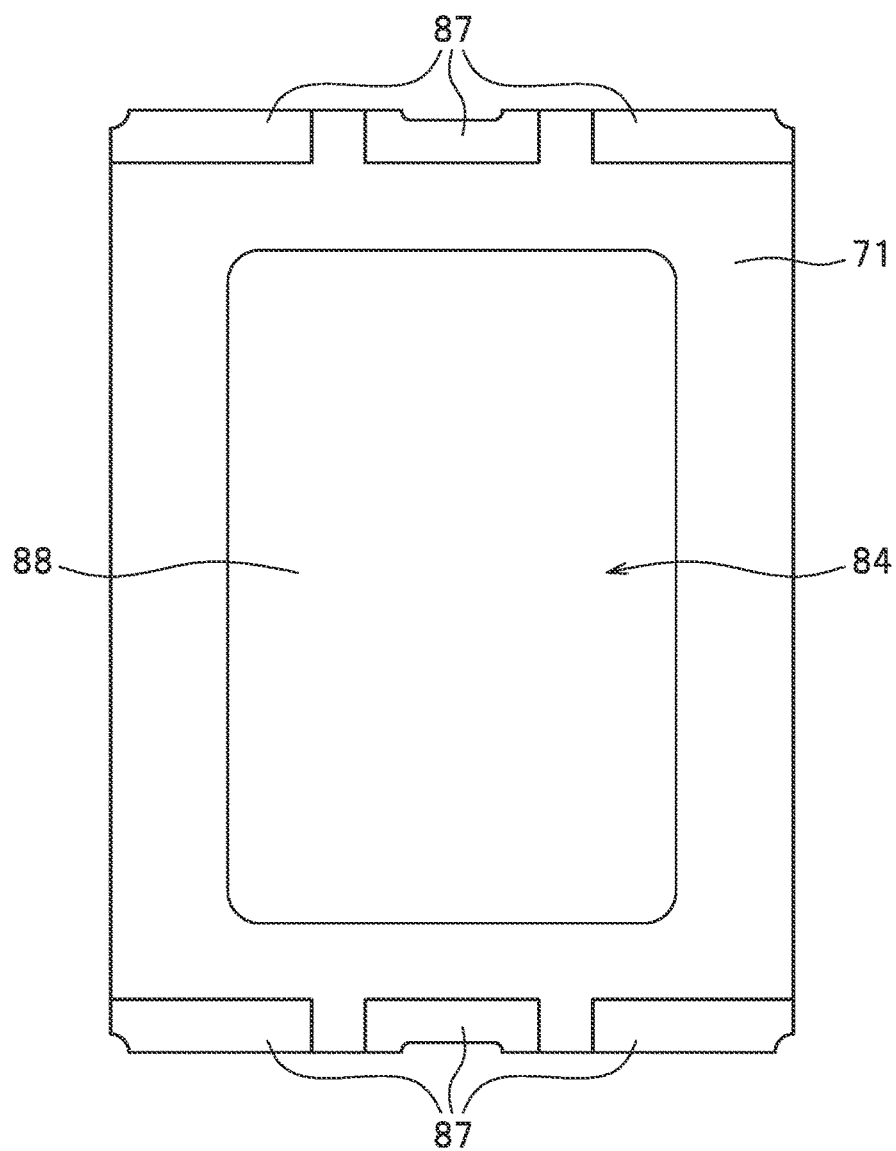

CIRCUIT BOARD, LIGHT EMITTING DEVICE, AND MANUFACTURING METHOD THEREOF

CROSS-REFERENCE TO RELATED PATENT APPLICATION

The present application claims priority under 35 U.S.C. § 119 to Japanese Patent Application No. 2021-129820, filed Aug. 6, 2021, the contents of which are incorporated herein by reference in their entirety.

BACKGROUND

The present disclosure relates to a circuit board, a light emitting device, and a manufacturing method thereof.

For example, a method is known in which a wiring substrate having a copper foil layer formed on a surface of an insulating portion is layered on a copper plate member having a convex metal post member formed thereon to form a layered substrate. In manufacturing such a layered substrate, a method is used in which a copper plate on which a post member is formed and a wiring substrate on which a circuit pattern of the copper foil is formed are bonded to each other to form a circuit board (for example, Japanese Unexamined Patent Publication No. 2017-73513).

SUMMARY

According to one aspect of the present disclosure, a manufacturing method for a circuit board includes preparing a first substrate including a convex post member formed on a top surface side, and a second substrate including a first surface and a second surface opposite to the first surface, including a first metal layer formed at least on the first surface, and including an opening through which a top surface of the post member is uncovered in a plan view, bonding at least a portion of a top surface of the first substrate excluding the post member and the second surface of the second substrate so that the top surface of the post member is uncovered through the opening, and forming a circuit pattern by removing a portion of the first metal layer, wherein in the forming of the circuit pattern, the portion of the first metal layer is removed such that another portion of the first metal layer surrounds a periphery of the post member in a plan view.

According to another aspect of the present disclosure, a manufacturing method for a light emitting device includes manufacturing a circuit board by the manufacturing method for a circuit board, and placing a light emitting component on the post member of the circuit board.

According to another aspect of the present disclosure, a circuit board includes a first substrate including a convex post member formed on a top surface side, and a second substrate including a first surface and a second surface opposite to the first surface and a first metal layer being formed on at least the first surface, the second substrate being disposed such that at least a portion of a top surface of the first substrate excluding the post member faces the second surface, wherein the second substrate includes an opening through which a top surface of the post member is uncovered in a plan view, and the second substrate includes the first metal layer that in direct contact with a periphery of the post member or annularly disposed at a predetermined distance from the post member, and a circuit pattern made of the same material as the first metal layer.

According to a further aspect of the present disclosure, a light emitting device includes the circuit board, and a light emitting component placed on the post member of the circuit board.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIG. 18C is a schematic cross-sectional view taken along line XVIIIC-XVIIIC of FIG. 18B.

FIG. 18D is a bottom view schematically illustrating a configuration of a bottom surface of the light emitting component.

DETAILED DESCRIPTION

Figure 1A:
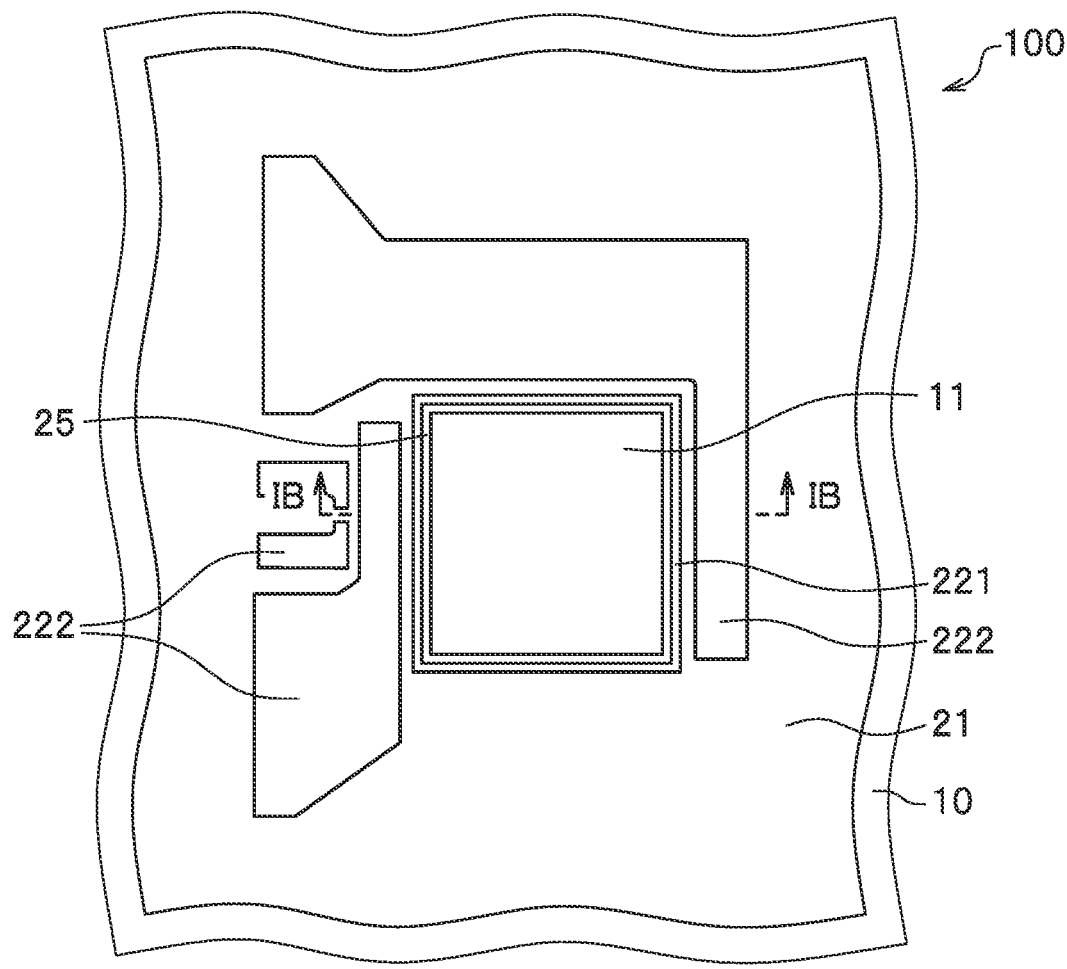
FIG. 1A is a plan view schematically illustrating an example of a circuit board according to an embodiment.

Embodiments will be described below with reference to the drawings. However, the embodiments described below are merely examples of a circuit board, a light emitting device, and a manufacturing method thereof for embodying the technical idea of the present embodiment, and the invention is not limited to these embodiments. In addition, dimensions, materials, shapes, relative arrangements, or the like of components described in the embodiments are not intended to limit the scope of the present invention thereto, unless otherwise specified, and are merely exemplary. Note that, size, positional relationship, and the like of members illustrated in the drawings can be exaggerated or simplified for clarity of description.

Circuit Board

Figure 1B:
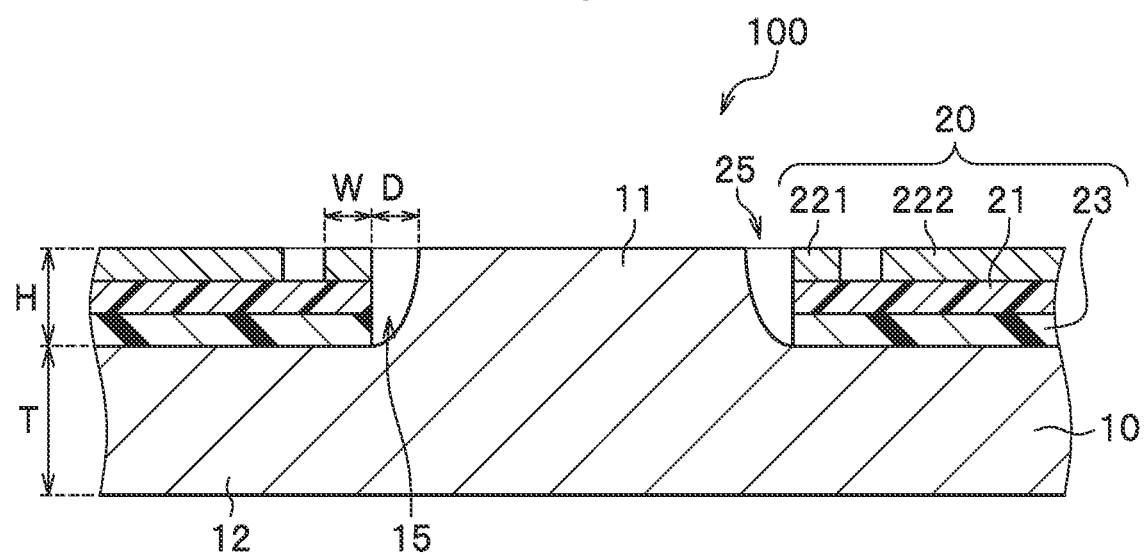
FIG. 1B is a schematic cross-sectional view taken along line IB-IB in FIG. 1A.

FIG. 1A is a plan view schematically illustrating an example of a circuit board according to an embodiment. FIG. 1B is a schematic cross-sectional view taken along line IB-IB in FIG. 1A.

A circuit board 100 includes a first substrate 10 having a convex post member 11 formed on a top surface side, and a second substrate 20 including a first surface and a second surface opposite to the first surface, a first metal layer 221 being formed on at least the first surface, the second substrate 20 being disposed such that at least a portion of a top surface of the first substrate 10 excluding the post member 11 faces the second surface. The second substrate 20 includes an opening 25 through which a top surface of the post member 11 is uncovered in a plan view. Additionally, the second substrate 20 includes the first metal layer 221 that is in direct contact with a periphery of the post member 11 or annularly disposed at a predetermined distance from the post member 11, and a circuit pattern 222 made of the same material as the first metal layer 221.

The first substrate 10 includes a flat plate member 12 and the convex post member 11 protruding from the flat plate member 12. The flat plate member 12 and the post member 11 are integrally formed. Side surfaces of the post member 11 have a curved shape that is convex inward on the side surfaces facing each other in a cross-sectional view. However, the side surfaces of the post member 11 may have a curved shape that is convex outward on the side surfaces facing each other, or may have a linear shape. The post member 11 is formed by etching or pressing the substrate. The thickness T of the flat plate member 12 is preferably in a range from 1 mm to 2 mm. When the thickness T of the flat plate member 12 is 1 mm or more, the strength of the first substrate 10 can be improved. On the other hand, when the thickness T is 2 mm or less, the first substrate 10 can be made thinner. Note that in a case in which a slight difference in the thickness occurs depending on a portion of the flat plate member 12 when forming the post member 11, the thickness T can be the average thickness of the flat plate member 12. The post member 11 is formed in a rectangular shape in a plan view, but may be a polygon such as a square or a trapezoid, a circle, an ellipse, or any other shape. Additionally, the corner portion of the post member 11 is formed at a right angle, but may be rounded.

A height from the top surface of the first substrate 10 excluding the post member 11, that is, the top surface of the flat plate member 12 to the top surface of the post member 11 is preferably in a range from 50 μm to 150 μm. That is, the height H of the post member 11 is preferably in a range from 50 μm to 150 μm. When the height H of the post member 11 is 50 μm or more, the thickness of the second substrate 20 disposed on the first substrate 10 is easily adjusted. On the other hand, when the height H is 150 μm or less, the first substrate 10 can be made thinner. Note that in a case in which a slight difference occurs in the thickness depending on a portion of the flat plate member 12 when forming the post member 11, the height H here can be the average height from the top surface of the flat plate member 12 to the top surface of the post member 11.

The first substrate 10 is preferably a metal plate using a metal material. By configuring the first substrate 10 to be a metal plate, heat dissipation functions that emit heat generated from a light emitting component 50, etc. are excellent. As the metal material of the first substrate 10, for example, a single metal such as Cu, Ag, Al, Ni, Rh, Au, Ti, Pt, Pd, Mo, Cr, or W, or an alloy containing these metals can be used. In particular, the first substrate 10 is preferably a copper plate using Cu from the perspective of heat dissipation and economic efficiency. For example, the first substrate 10 is preferably made of a material containing 90 mass % or more of copper. More preferably, the material is made of a material containing 95 mass % or more of copper, and more preferably made of a material containing 99 mass % or more of copper.

The second substrate 20 includes a base material 21, and the first metal layer 221 and the circuit pattern 222 disposed on the base material 21. It further includes a bonding sheet 23 on the bottom surface of the base material 21.

The base material 21 has an insulating property, and, for example, a film-shaped polyimide can be used. The thickness of the base material 21 is preferably in a range from 12 m to 50 μm. When the thickness of the base material 21 is 12 μm or more, the strength of the base material 21 can be improved. On the other hand, when the thickness is 50 μm or less, the second substrate 20 can be made thinner. Note that, as the base material 21, a glass epoxy obtained by impregnating one or a plurality of glass cloths with a thermosetting insulating resin such as an epoxy resin and curing the thermosetting insulating resin, a liquid crystal polymer, etc., may be used. When the base material 21 is a glass epoxy, the thickness can be, for example, in a range from 50 μm to 150 μm, and preferably in a range from 20 μm to 130 μm corresponding to the height of the post member 11.

A metal material can be used for the first metal layer 221 and the circuit pattern 222, and for example, a simple substance metal such as Cu, Ag, Al, Ni, Rh, Au, Ti, Pt, Pd, Mo, Cr, or W, or an alloy containing these metals can be suitably used. In particular, the first metal layer 221 and the circuit pattern 222 are preferably a copper foil using Cu from the perspective of conductivity and economic efficiency. For example, the first metal layer 221 and the circuit pattern 222 are preferably made of a material containing 90 mass % or more of copper. More preferably, the material is made of a material containing 95 mass % or more of copper, and more preferably made of a material containing 99 mass % or more of copper.

The bonding sheet 23 is a member that adheres the first substrate 10 and the second substrate 20. Examples of the bonding sheet 23 include those known in the art such as a heat-resistant resin sheet and a UV-curable sheet.

The thickness of the first metal layer 221 and the circuit pattern 222 is preferably in a range from 12 μm to 70 μm. When the thickness of the first metal layer 221 and the circuit pattern 222 is 12 μm or more, the first metal layer 221 and the circuit pattern 222 are easily formed. On the other hand, when the thickness is 70 μm or less, the second substrate 20 can be made thinner. Additionally, the first metal layer 221 and the circuit pattern 222 have preferably the same thickness. With such a configuration, the first metal layer 221 and the circuit pattern 222 can be easily formed, and can be aligned to the same height.

The top surface of the post member 11, the top surface of the first metal layer 221, and the top surface of the circuit pattern 222 are preferably flush with each other. With such a configuration, it becomes easy to form the first metal layer 221 and the circuit pattern 222, which makes easy to place the light emitting component 50 on the circuit board 100 when manufacturing the light emitting device 200.

Note that the term "flush" means that the top surfaces of the respective members are positioned at a portion in the same plane, and includes the case in which the top surfaces of the respective members are separated from each other.

The second substrate 20 includes an opening 25 through which the post member 11 is uncovered. The opening 25 is formed in a size such that the entire post member 11 is housed. A gap 15 is preferably formed between the side surface of the post member 11 and the inner side surface of the opening 25. The gap 15 makes it easy to insert the post member 11 into the opening 25. In addition, an agent or the like can be suppressed from entering the post member 11 side from the outer side of the first metal layer 221 and coming into contact with the post member 11, which makes easier to protect the post member 11. Because the circuit board 100 has such a gap 15, an aperture of the opening 25 is formed larger than the post member 11 in a plan view. The plan view shape of the opening 25 may be determined as appropriate along the shape of the post member 11. In the present embodiment, the shape is formed in a rectangular shape along the shape of the post member 11. The plan view shape of the opening 25 is preferably similar to the shape of the post member 11. The area of the opening 25 is preferably in a range from 1.05 times to 2 times the area of the post member 11, and even more preferably in a range from 1.1 times to 1.8 times.

The first metal layer 221 annularly surrounds the periphery of the post member 11. The term "annular" means a shape formed in a frame shape, for example, a rectangular annular shape, a square annular shape, a ring annular shape, etc. The first metal layer 221 is formed in a rectangular annular shape in a plan view along the shape of the post member 11. The first metal layer 221 may surround the periphery of the post member 11, or may be a square annular shape or a ring annular shape, or other annular shape, along the shape of the post member 11 or regardless of the shape of the post member 11.

Because the circuit board 100 includes the first metal layer 221, for example, when the light emitting component 50 is placed on the circuit board 100 to manufacture the light emitting device 200, an agent or the like is suppressed from entering the post member 11 side from the outside of the first metal layer 221, or foreign matter is suppressed from entering the post member 11 side from the outside of the first metal layer 221. Therefore, the post member 11 is protected by the first metal layer 221. Also, as described below, when the circuit board 100 is manufactured, the circuit pattern 222 is formed after the first substrate 10 and the second substrate 20a are bonded, and thus the accuracy of the circuit pattern 222 does not deteriorate. Additionally, when forming the circuit pattern 222, the post member 11 is protected from the agent or the like by the first metal layer 221.

As a result, the circuit board 100 has high dimensional accuracy. Here, the term "high dimensional accuracy" means that, for example, the post member 11 is not damaged, or the accuracy of the circuit pattern 222 is not deteriorated due to a positional deviation, a change in shape, etc. of the circuit pattern 222, and the designed desired dimensions and processing accuracy are obtained.

The first metal layer 221 is disposed at a predetermined distance from the post member 11. The distance D between the top surface of the post member 11 and the first metal layer 221 is preferably, for example, in a range from 100 μm to 300 μm. When the distance D is 100 μm or more, the post member 11 can be easily inserted into the opening 25. In addition, when an agent or the like enters the post member 11 side from the outside of the first metal layer 221, the post member 11 can be more easily protected. On the other hand, when the distance D is 300 µm or less, the gap 15 can be made smaller, and thus foreign matter is suppressed from being mixed in the gap 15. This makes it easier to protect the post member 11. Note that, because the side surface of the post member 11 is curved, the distance D here is the shortest distance between the outer end of the post member 11 in the portion of the top surface of the post member 11 and the inner end of the first metal layer 221 in the portion of the top surface of the first metal layer 221.

It is preferable that the first metal layer 221 and the circuit pattern 222 are separated from each other in a plan view. Such a configuration makes it easier to form the desired circuit pattern 222.

The width W of the first metal layer 221 annularly disposed around the post member 11 is preferably in a range from 50 µm to 100 µm. When the width W of the first metal layer 221 is 50 µm or more, the agent or the like can further be suppressed from entering the post member 11 side from the outer side of the first metal layer 221, which makes easier to protect the post member 11. On the other hand, when the width W is 100 µm or less, the region forming the circuit pattern 222 can be increased, and the desired circuit pattern 222 is easily formed.

The circuit board 100 is disposed such that the entire top surface of the first substrate 10 excluding the post member 11, that is, the entire top surface of the flat plate member 12 faces the second surface of the second substrate 20. However, the circuit board 100 may be disposed such that a portion of the top surface of the flat plate member 12 and the second surface of the second substrate 20 face each other. In other words, there may be a portion where the second substrate 20 is not disposed on the top surface of the flat plate member 12.

Light Emitting Device

Subsequently, a light emitting device will be described.

Figure 2A:
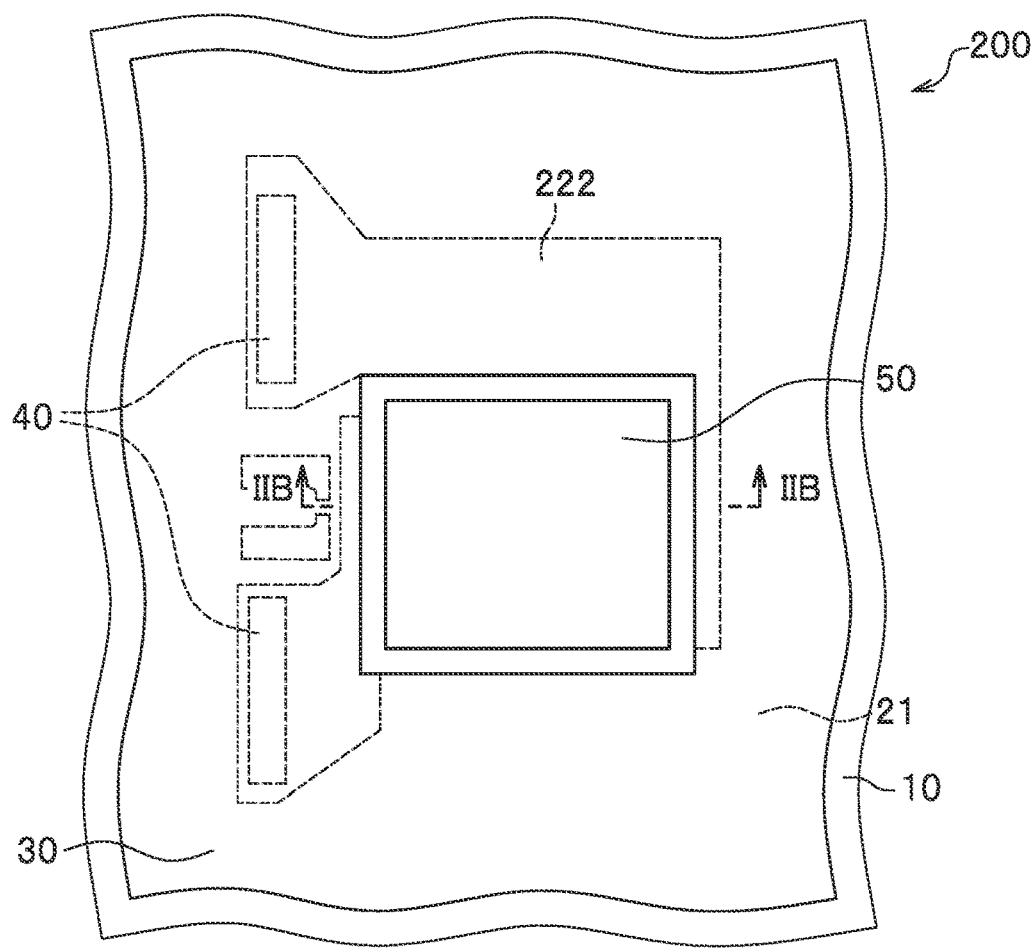
FIG. 2A is a plan view schematically illustrating an example of a light emitting device according to the embodiment.
Figure 2B:
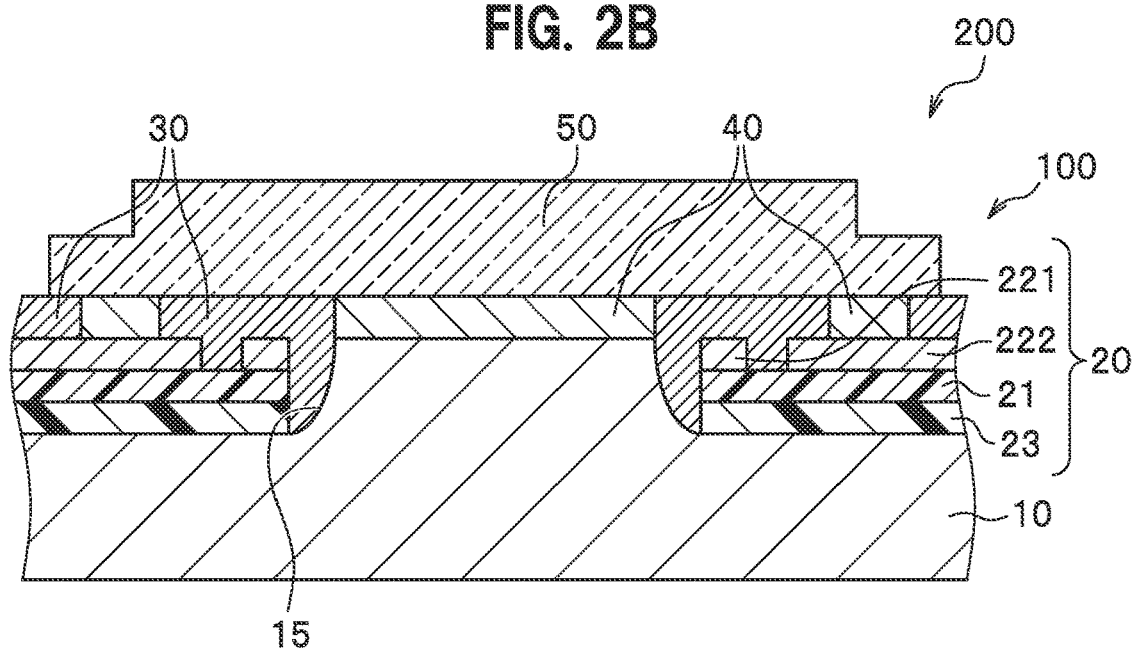
FIG. 2B is a schematic cross-sectional view taken along line IIB-IIB in FIG. 2A.

FIG. 2A is a plan view schematically illustrating an example of a light emitting device according to the embodiment. FIG. 2B is a schematic cross-sectional view taken along line IIB-IIB in FIG. 2A.

A light emitting device 200 includes the circuit board 100 and a light emitting component 50 placed on the post member 11 of the circuit board 100.

The light emitting device 200 preferably includes at least the circuit board 100, a resist 30, and a plating layer 40, and the light emitting component 50.

The circuit board 100 is configured as described above.

The resist 30 is insulating, for example, a solder resist. The resist 30 is provided on, for example, a portion other than a portion where the plating layer 40 is formed on the circuit board 100. As the resist 30, for example, a general resist obtained by mixing a solvent, an antifoaming agent, etc. with a copolymer resin such as epoxy, or a resist whitened by adding a filler such as titanium oxide can be used.

The plating layer 40 is provided, for example, on the post member 11 and on a portion of the circuit pattern 222. As the plating layer 40, for example, Au, Ag, Cu, Pt, Ni, Pd, or an alloy containing one of these can be used. When the plating layer 40 is made of these materials, the reflectance of light emitted from the light emitting component 50 to the circuit board 100 side can be increased.

The light emitting component 50 is placed on and around the post member 11 of the circuit board 100 via the plating layer 40. The light emitting component 50 is adhered to the circuit board 100 by, for example, an adhesive member such as a solder paste.

As the light emitting component 50, for example, a light emitting component in which a known light emitting element is placed on a substrate, a package, etc. can be used. Examples of the light emitting element include semiconductor laser elements, LED (Light Emitting Diode), organic electroluminescence elements, etc. Further, the light emitting component 50 may be a known light emitting element itself. That is, the light emitting device 200 may be a device in which a light emitting component including at least a light emitting element is placed on the circuit board 100, or a device in which a light emitting element is directly placed on the circuit board 100.

Manufacturing Method for Circuit Board

Subsequently, an example of a manufacturing method for the circuit board according to the embodiment will be described.

Figure 3:
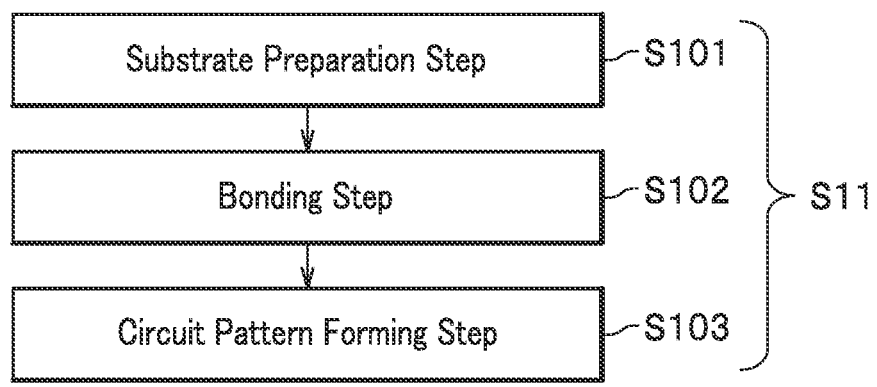
FIG. 3 is a flowchart illustrating a manufacturing method for the circuit board according to the embodiment.

FIG. 3 is a flowchart illustrating a manufacturing method for the circuit board according to the embodiment. FIGS. 4A to 12C are drawings in the manufacturing method for a circuit board according to the embodiment.

Figure 4A:
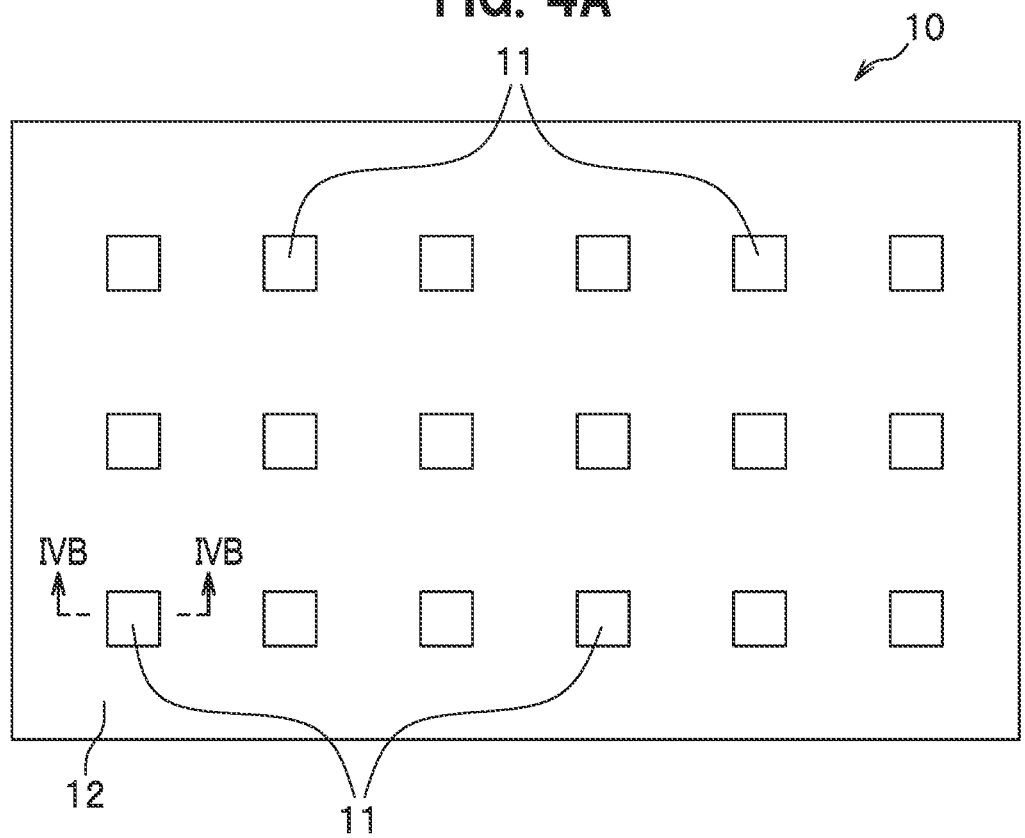
FIG. 4A is a plan view schematically illustrating a first substrate on which a post member is formed in the manufacturing method for a circuit board according to the embodiment.
Figure 4B:
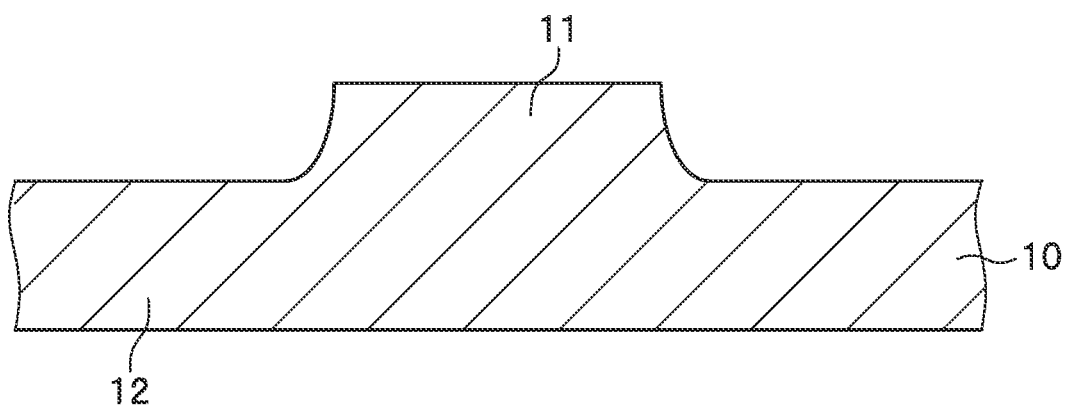
FIG. 4B is a schematic cross-sectional view taken along line IVB-IVB of FIG. 4A.
Figure 5A:
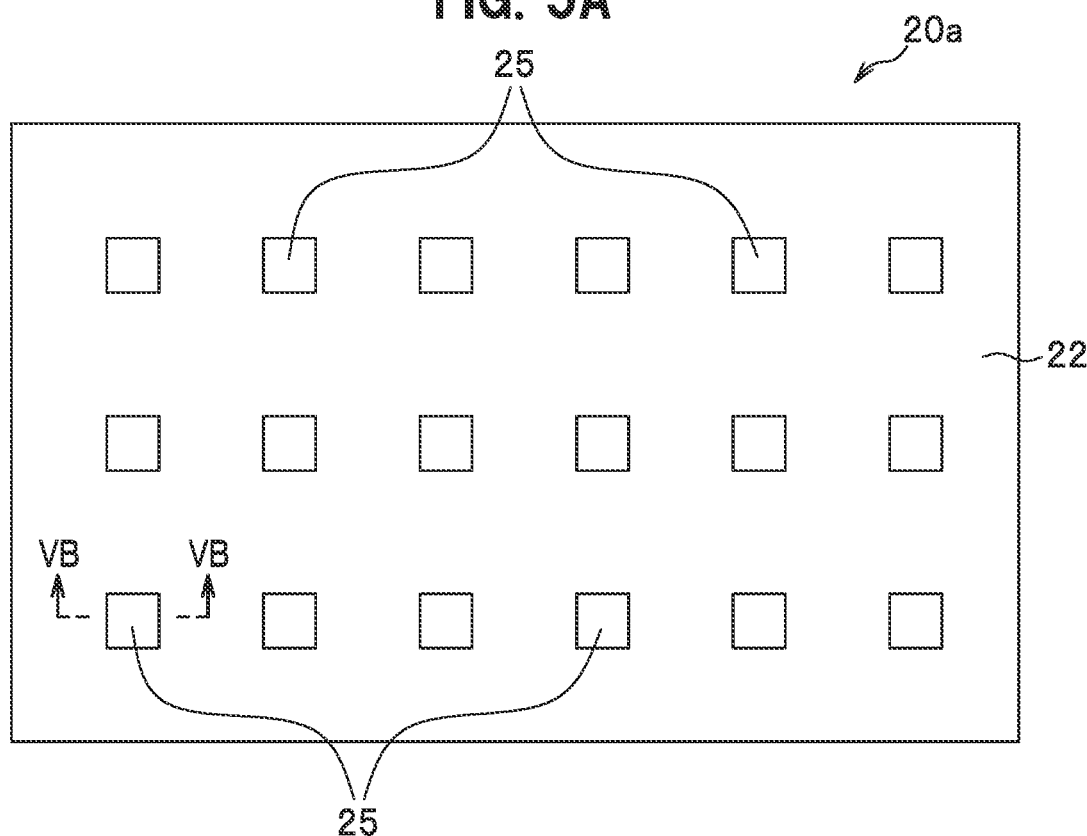
FIG. 5A is a plan view schematically illustrating a second substrate having an opening formed therein in the manufacturing method for a circuit board according to the embodiment.
Figure 5B:
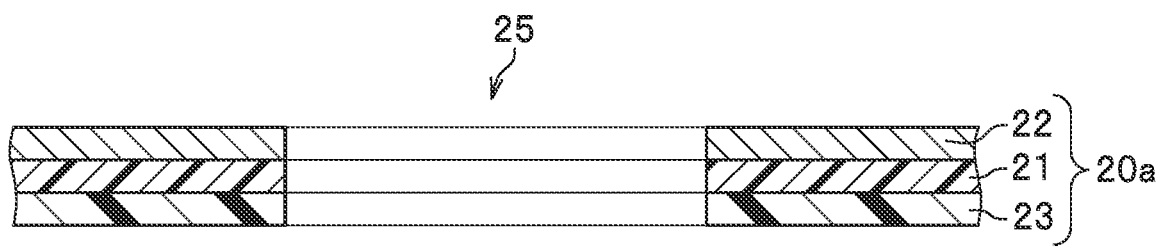
FIG. 5B is a schematic cross-sectional view taken along line VB-VB of FIG. 5A.
Figure 6A:
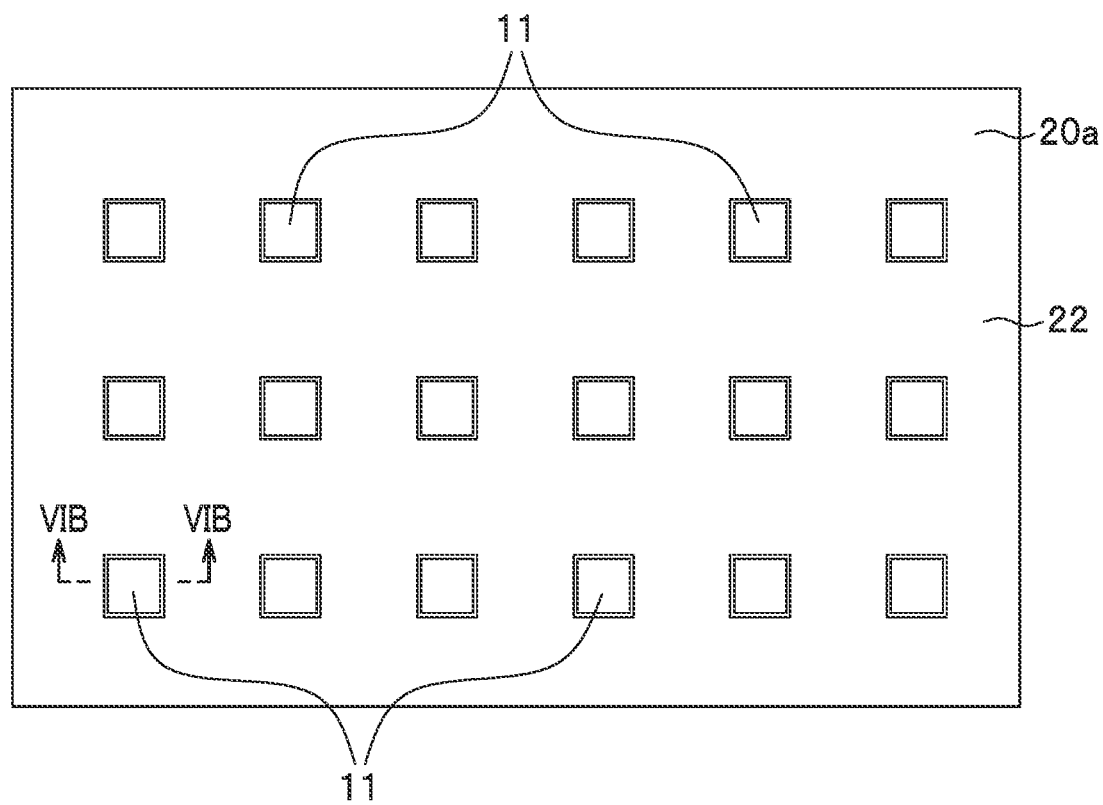
FIG. 6A is a plan view schematically illustrating a state in which a first substrate and a second substrate are bonded to each other in the manufacturing method for a circuit board according to the embodiment.
Figure 6B:
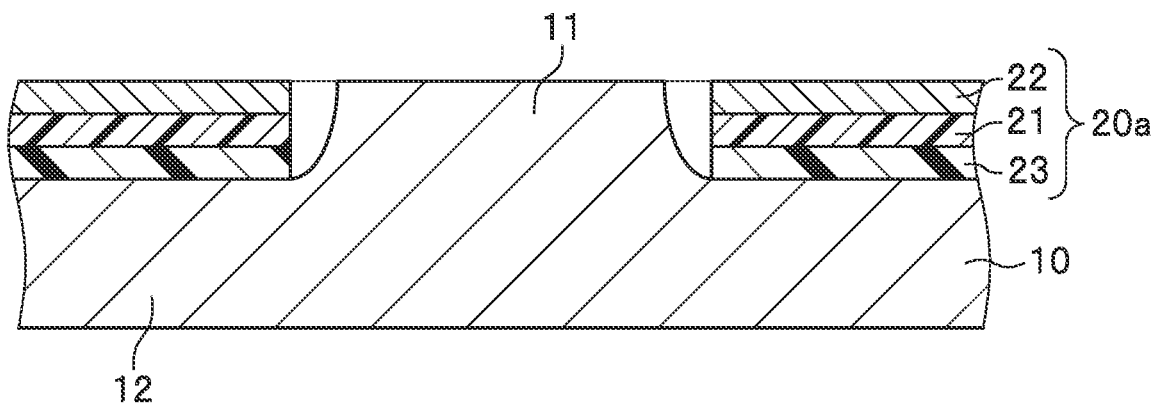
FIG. 6B is a schematic cross-sectional view taken along line VIB-VIB of FIG. 6A.

FIG. 4A is a plan view schematically illustrating the first substrate on which a post member is formed. FIG. 4B is a schematic cross-sectional view taken along line IVB-IVB of FIG. 4A. FIG. 5A is a plan view schematically illustrating the second substrate having an opening formed therein. FIG. 5B is a schematic cross-sectional view taken along line VB-VB of FIG. 5A. FIG. 6A is a plan view schematically illustrating a state in which the first substrate and the second substrate are bonded to each other. FIG. 6B is a schematic cross-sectional view taken along line VIB-VIB of FIG. 6A.

Figure 7A:
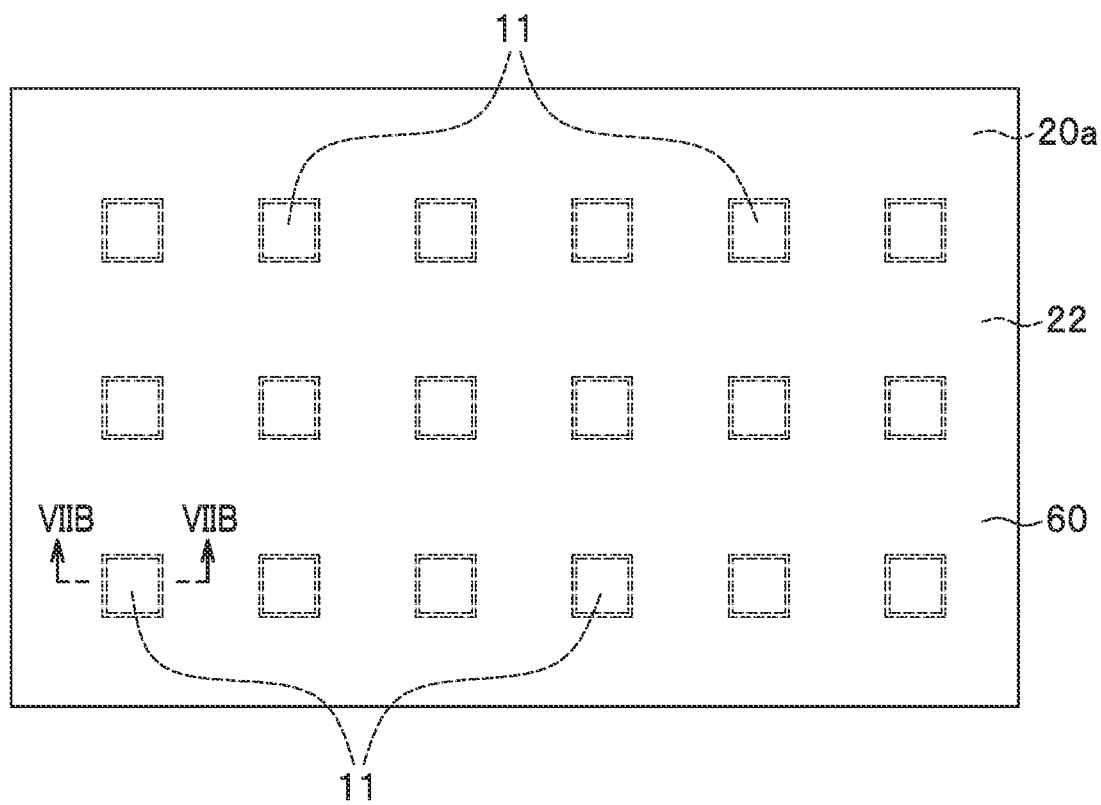
FIG. 7A is a plan view schematically illustrating a state in which a dry film is provided in the manufacturing method for a circuit board according to the embodiment.
Figure 7B:
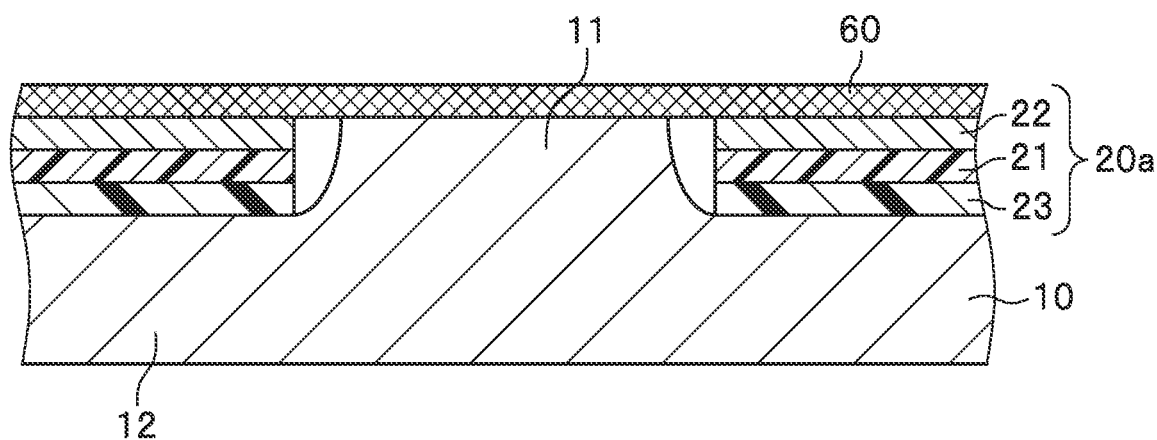
FIG. 7B is a schematic cross-sectional view taken along line VIIB-VIIB of FIG. 7A.
Figure 8A:
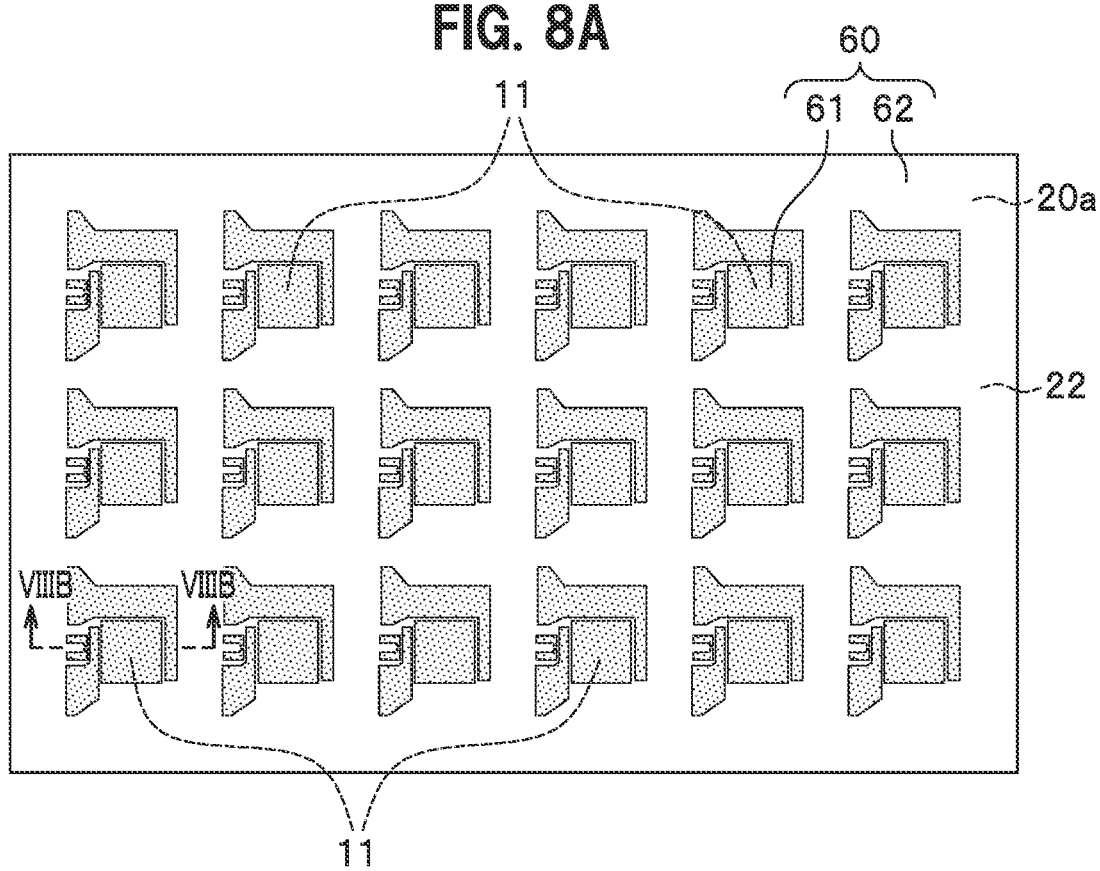
FIG. 8A is a plan view schematically illustrating a state in which a portion of the dry film is exposed in the manufacturing method for a circuit board according to the embodiment.
Figure 8B:
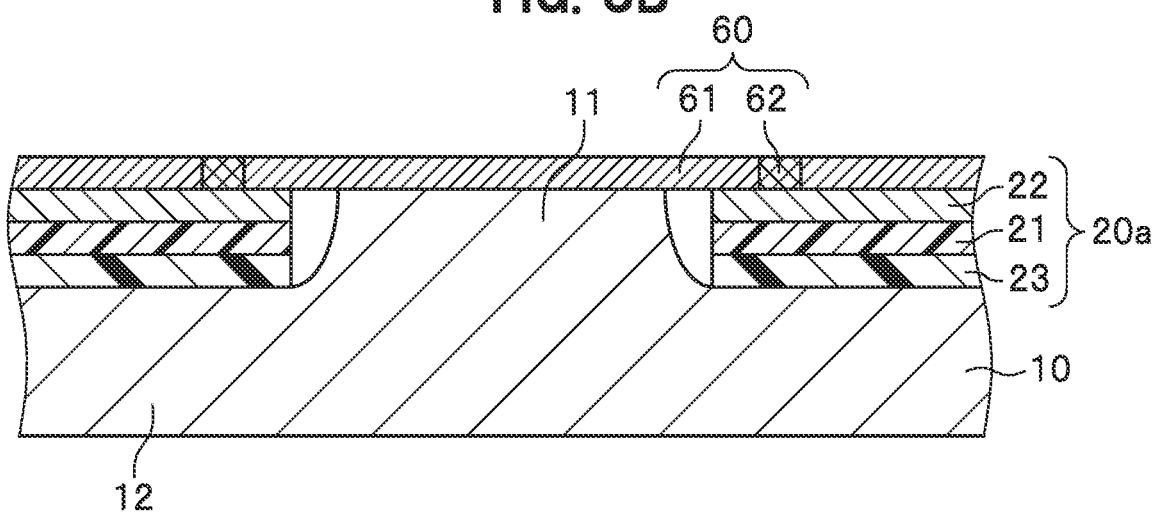
FIG. 8B is a schematic cross-sectional view taken along line VIIB-VIIB of FIG. 8A.
Figure 9A:
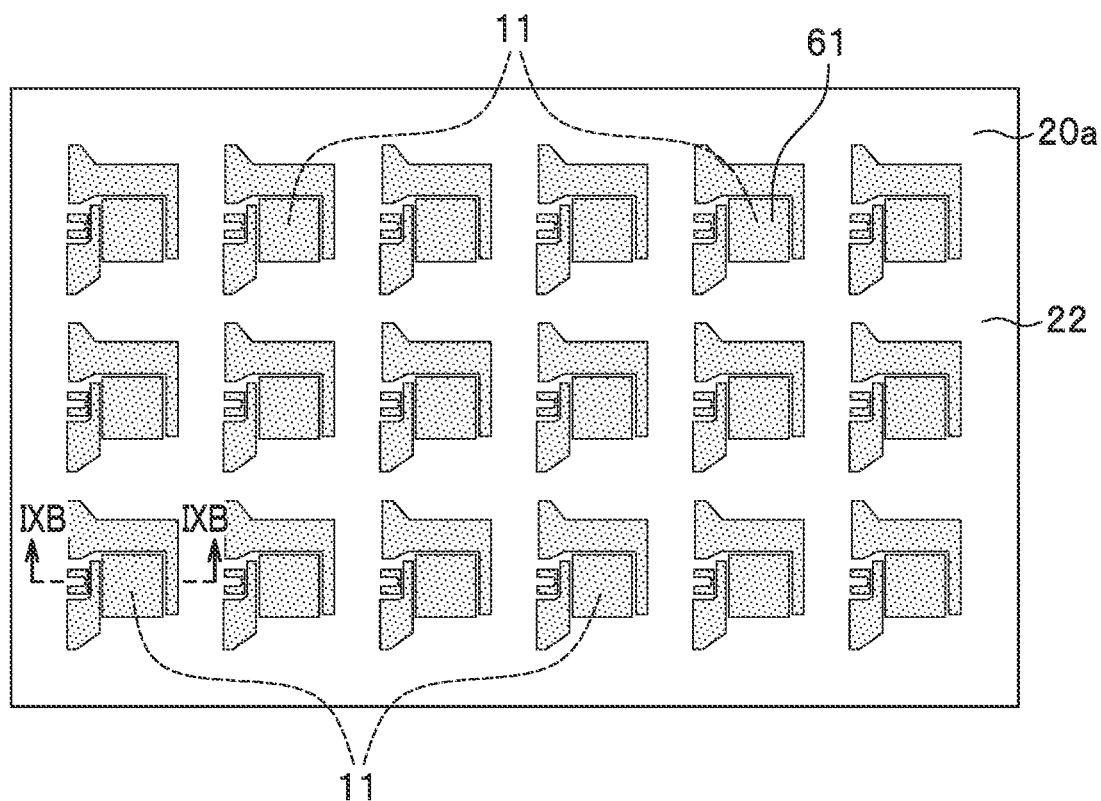
FIG. 9A is a plan view schematically illustrating a state in which a dry film at a location other than an exposed location is removed in the manufacturing method for the circuit board according to the embodiment.
Figure 9B:
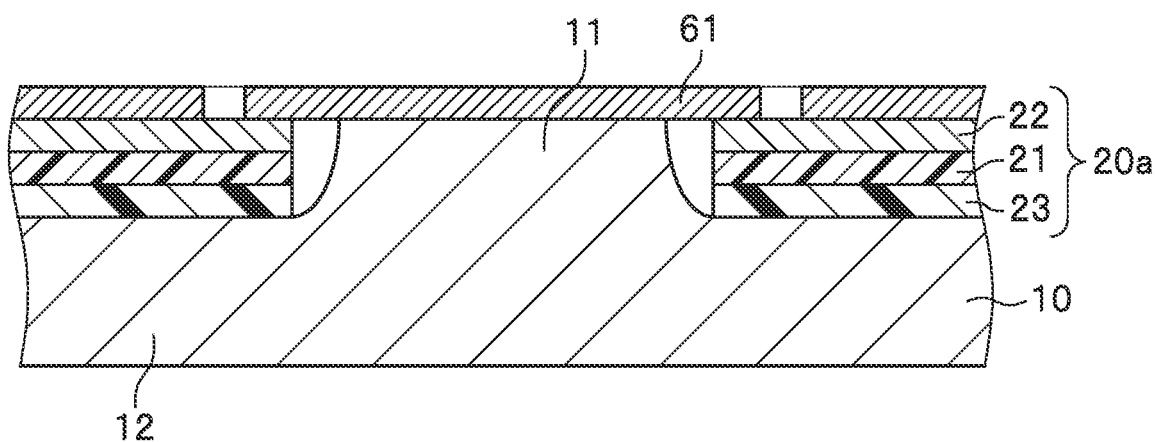
FIG. 9B is a schematic cross-sectional view taken along line IXB-IXB of FIG. 9A.
Figure 10A:
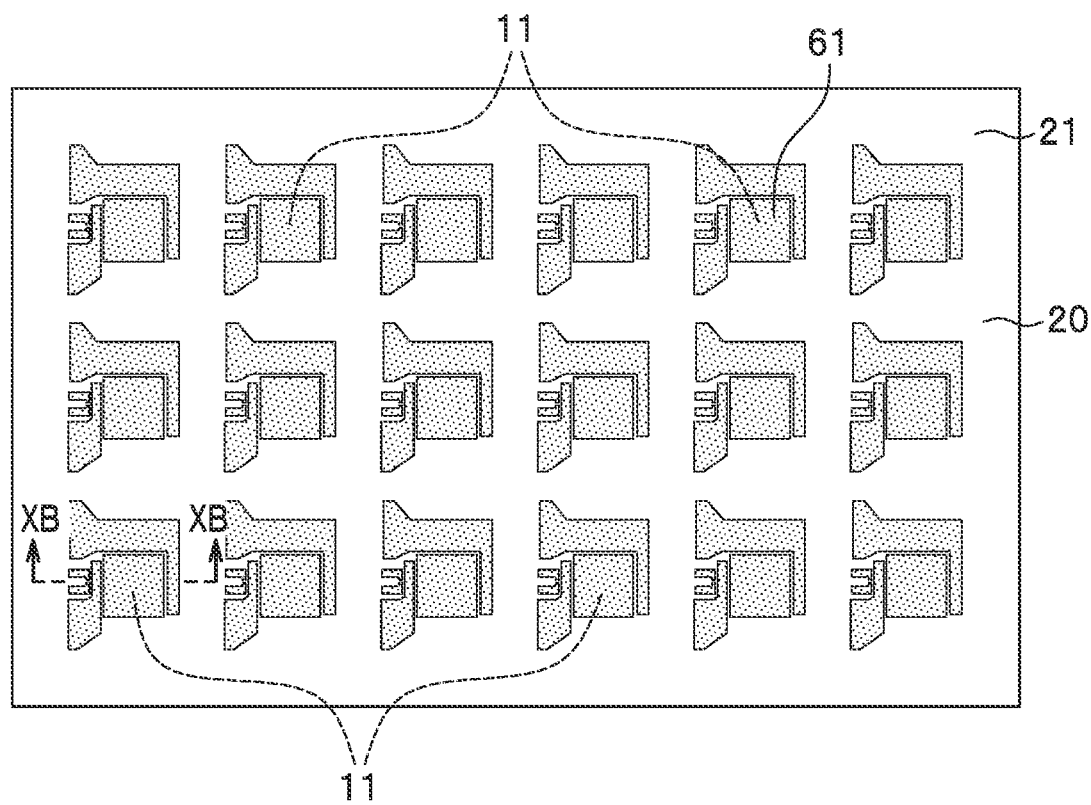
FIG. 10A is a plan view schematically illustrating a state in which a portion of the first metal layer is removed in the manufacturing method for the circuit board according to the embodiment.
Figure 10B:
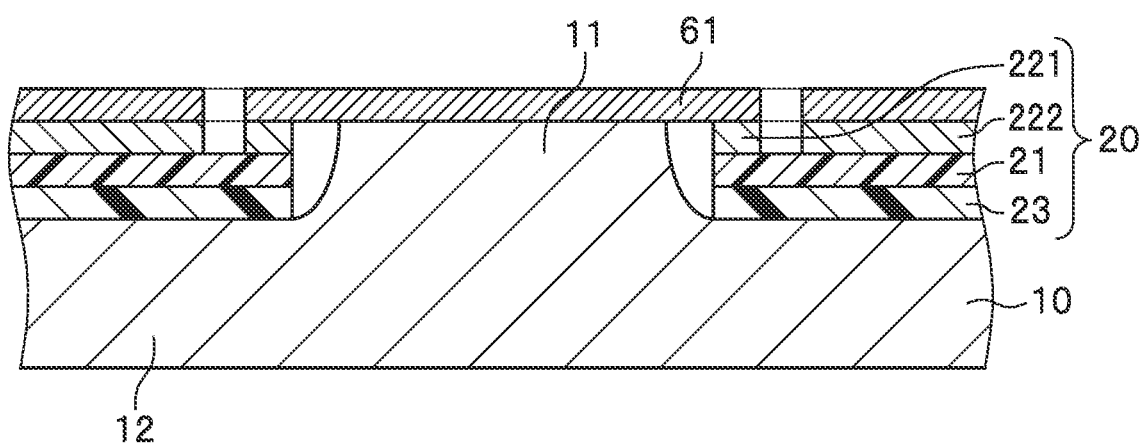
FIG. 10B is a schematic cross-sectional view taken along line XB-XB in FIG. 10A.
Figure 11A:
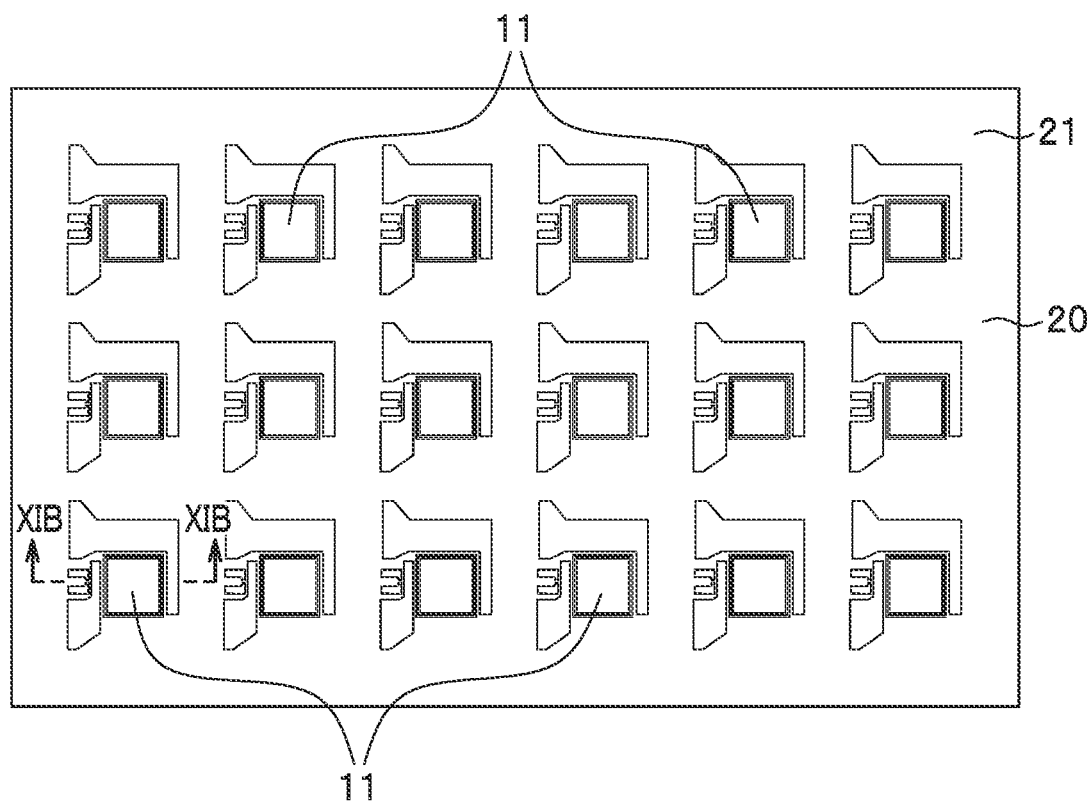
FIG. 11A is a plan view schematically illustrating a state in which the dry film at the exposed location is removed in the manufacturing method for the circuit board according to the embodiment.
Figure 11B:
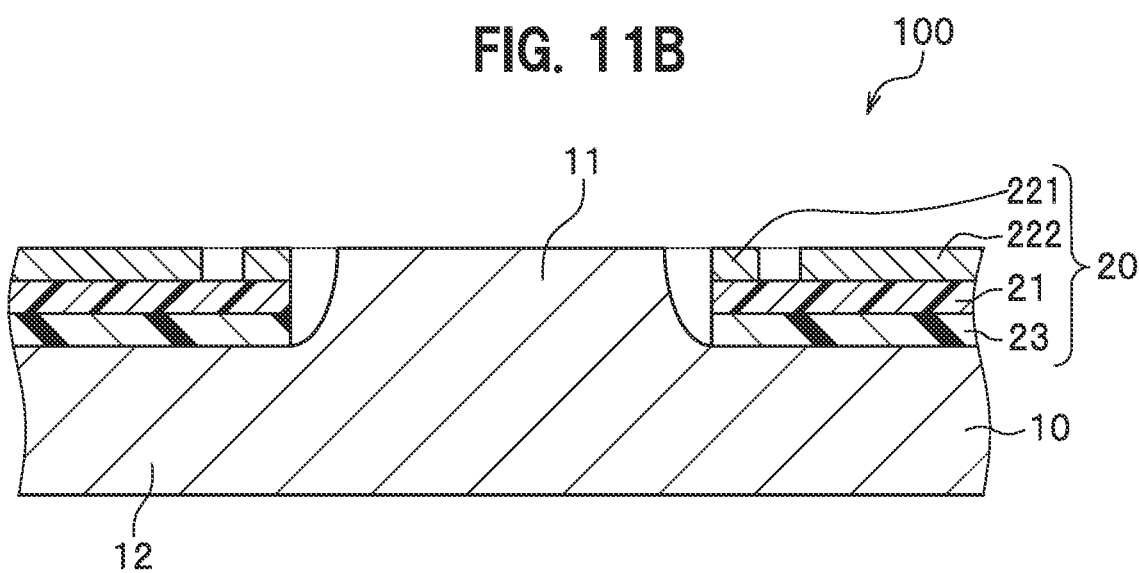
FIG. 11B is a schematic cross-sectional view taken along line XIB-XIB in FIG. 11A.

FIG. 7A is a plan view schematically illustrating a state in which a dry film is provided. FIG. 7B is a schematic cross-sectional view taken along line VIIB-VIIB of FIG. 7A. FIG. 8A is a plan view schematically illustrating a state in which a portion of the dry film is exposed. FIG. 8B is a schematic cross-sectional view taken along line VIIIB-VIIIB of FIG. 8A. FIG. 9A is a plan view schematically illustrating a state in which a dry film at a location other than an exposed location is removed. FIG. 9B is a schematic cross-sectional view taken along line IXB-IXB of FIG. 9A. FIG. 10A is a plan view schematically illustrating a state in which a portion of the first metal layer is removed. FIG. 10B is a schematic cross-sectional view taken along line XB-XB in FIG. 10A. FIG. 11A is a plan view schematically illustrating a state in which the dry film at the exposed location is removed. FIG. 11B is a schematic cross-sectional view taken along line XIB-XIB in FIG. 11A.

Figure 12A:
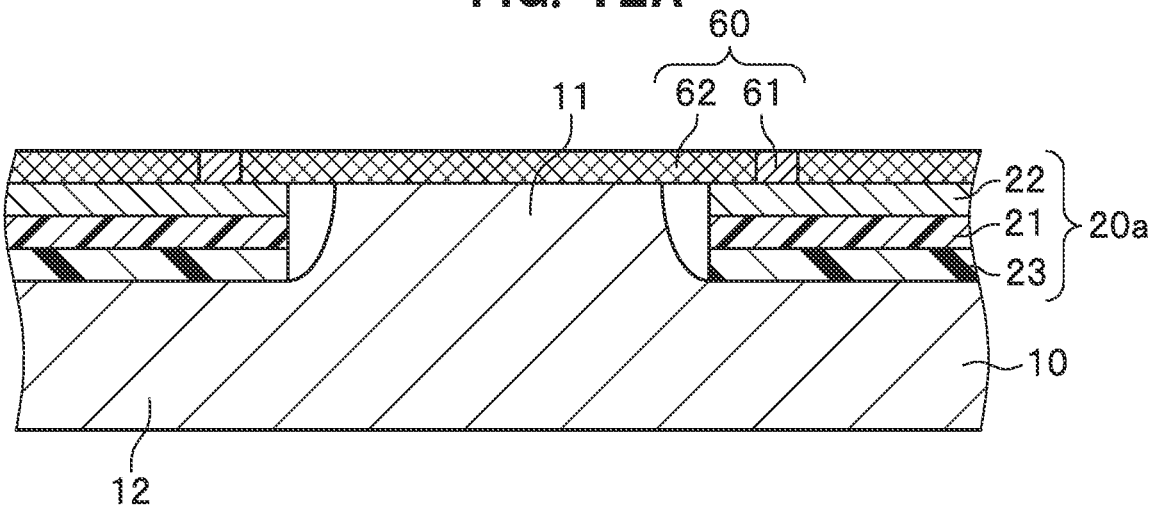
FIG. 12A is a cross-sectional view schematically illustrating a state in which the portion of the dry film is exposed in the manufacturing method for a circuit board according to the embodiment.
Figure 12B:
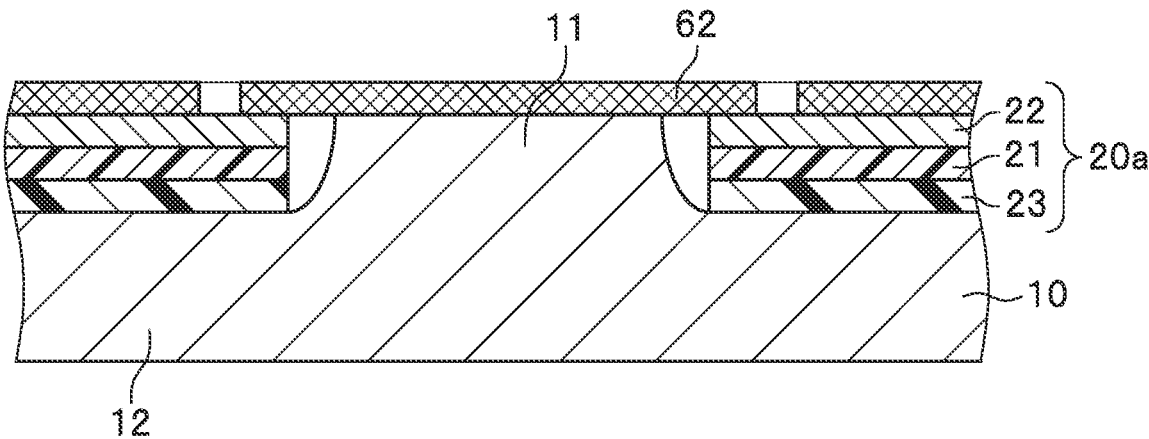
FIG. 12B is a cross-sectional view schematically illustrating a state in which the dry film at the exposed location is removed in the manufacturing method for a circuit board according to the embodiment.
Figure 12C:
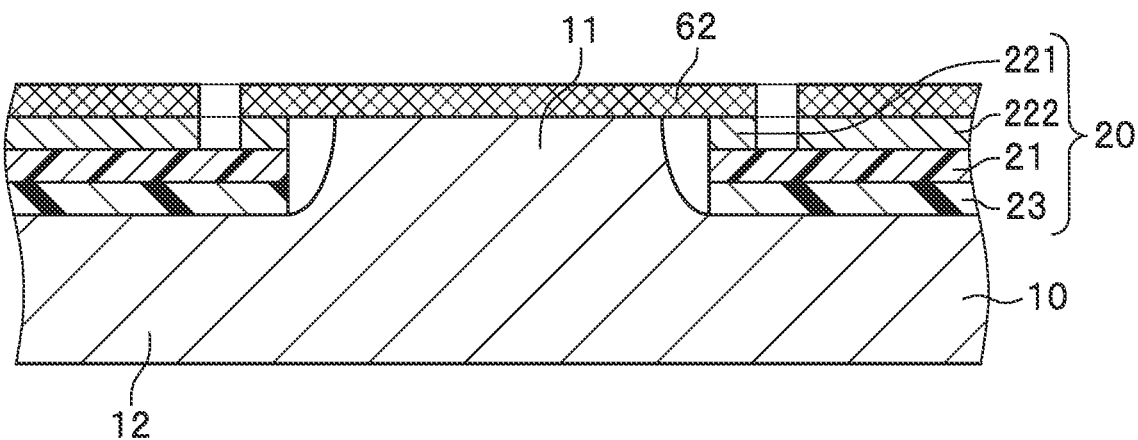
FIG. 12C is a cross-sectional view schematically illustrating a state in which the portion of the first metal layer is removed in the manufacturing method for a circuit board according to the embodiment.

FIG. 12A is a cross-sectional view schematically illustrating a state in which the portion of the dry film is exposed. FIG. 12B is a cross-sectional view schematically illustrating a state in which the dry film at the exposed location is removed. FIG. 12C is a cross-sectional view schematically illustrating a state in which the portion of the first metal layer is removed.

Note that in the manufacturing method for the circuit board according to the embodiment, a plurality of circuit boards are manufactured simultaneously.

The manufacturing method for the circuit board 100 includes preparing a first substrate 10 including a convex post member 11 formed on a top surface side, and a second substrate 20a having a first surface and a second surface opposite to the first surface, having a first metal layer 22 formed at least on the first surface, and having an opening 25 through which a top surface of the post member 11 is uncovered in a plan view, bonding at least a portion of a top surface of the first substrate 10 excluding the post member 11 and the second surface of the second substrate 20a so that the top surface of the post member 11 is uncovered through the opening 25, and forming a circuit pattern 222 by removing a portion of the first metal layer 22. Furthermore, in the forming of the circuit pattern 222, the portion of the first metal layer 22 is removed such that another portion of the first metal layer 22 surrounds a periphery of the post member 11 in a plan view.

Specifically, the manufacturing method for the circuit board 100 includes a substrate preparation step S101, a bonding step S102, and a circuit pattern forming step S103.

Note that the material, arrangement, or the like of each of the members are as in the description of the circuit board 100, and thus descriptions thereof will be omitted as appropriate.

The first metal layer 221 surrounding the periphery of the post member 11 and the circuit pattern 222 are formed by etching one first metal layer 22 provided on the base material 21, for example, and are made of the same material. The etched first metal layer 221 surrounding the periphery of the post member 11 is hereinafter referred to as an annular first metal layer 221 as appropriate.

Substrate Preparation Step

The substrate preparation step S101 is a step of preparing the first substrate 10 and the second substrate 20a.

In this step S101, as preparation of the first substrate 10, for example, first, a copper plate is etched or pressed to manufacture the first substrate 10 in which the post member 11 is formed.

In addition, in this step S101, as preparation of the second substrate 20a, for example, first, the base material 21 and a commercially available single-sided copper-clad layered plate in which a copper foil as the first metal layer 22 is attached to one side of the base material 21 are prepared. Subsequently, the bonding sheet 23 is provided on the surface of the base material 21 opposite to the surface on which the first metal layer 22 is provided. Alternatively, as preparation of the second substrate 20a, for example, a commercially available double-sided copper-clad layered plate having copper foils bonded to both surfaces thereof is prepared. Subsequently, the copper foil on one side is removed by etching, etc. to provide the bonding sheet 23. Note that the first metal layer 22 such as a copper foil may be joined to one surface of the base material 21 without using a commercially available single-sided copper-clad layered plate or double-sided copper-clad layered plate. Subsequently, the hole opening processing is performed at a desired position, and the opening 25 is formed. Alternatively, the second substrate 20a in which the base material 21 with the opening 25 and the first metal layer 22 are bonded may be used.

Bonding Step

The bonding step S102 is a step of bonding the first substrate 10 and the second substrate 20a.

In this step S102, the first substrate 10 and the second substrate 20a are bonded to each other by adhering the bonding sheet 23 of the second substrate 20a to the first substrate 10 so that the top surface of the post member 11 of the first substrate 10 is uncovered through the opening 25.

In the step of bonding the first substrate 10 and the second substrate 20a, the first substrate 10 and the second substrate 20a are preferably bonded so that the top surface of the post member 11 and a top surface of the first metal layer 22 are flush with each other. In order to make these top surfaces flush with each other, for example, the thicknesses of the flat plate member 12 and the height of the post member 11 of the first substrate 10, the thicknesses of the base material 21 and the thicknesses of the first metal layer 22 in the second substrate 20a, and the thicknesses of the bonding sheet 23 may be adjusted.

Circuit Pattern Forming Step

The circuit pattern forming step S103 is a step of removing a portion of the first metal layer 22 of the second substrate 20a to form the annular first metal layer 221 and the circuit pattern 222.

The step of forming the circuit pattern 222 preferably includes, as a negative type method, a step of providing the dry film 60 on the post member 11 and the first metal layer 22, a step of exposing the dry film 60 from a position of the post member 11 to a position where the dry film 60 is in contact with the first metal layer 22 around the post member 11 in a plan view and exposing the dry film 60 at a location where the circuit pattern 222 is to be formed, a step of developing the dry film 60 to remove a dry film 62 at a location other than the exposed location, and a step of etching the first metal layer 22 at a location where the first metal layer 22 is uncovered by removing a portion of the dry film 60, thus removing a portion of the first metal layer 22.

In this case, in this step S103, the dry film 60 is first provided on the entire top surface of the bonding material in which the first substrate 10 and the second substrate 20a are bonded. Subsequently, the mask is used to expose the dry film 60 along the shape of the desired annular first metal layer 221 and the shape of the desired circuit pattern 222. At this time, the dry film 60 is exposed from the position of the post member 11 to the position where the dry film 60 is in contact with the first metal layer 22 around the post member 11 so that when a portion of the first metal layer 22 is etched, another portion of the first metal layer 22 surrounds the periphery of the post member 11 in a plan view. Further, the dry film 60 is exposed at a location where the circuit pattern 222 is to be formed. Here, the "position in contact with the first metal layer 22" refers to the position of the outer end in the width direction of the annular first metal layer 221 when the annular first metal layer 221 surrounding the periphery of the post member 11 is formed on the top surface of the first metal layer 22. That is, the dry film 60 is exposed to a position where the annular first metal layer 221 is a desired width.

Subsequently, the dry film 60 is developed to remove the dry film 62 at a location other than the exposed location. Subsequently, the first metal layer 22 uncovered from the dry film 61 at the exposed location is removed by etching. Then, the dry film 61 at the exposed location is removed. As a result, the circuit board 100 in which the desired annular first metal layer 221 and the desired circuit pattern 222 are formed is manufactured.

Further, the step of forming the circuit pattern 222 preferably includes, as a positive type method, a step of providing the dry film 60 on the post member 11 and the first metal layer 22, a step of exposing the dry film 60 annularly to surround the periphery of the post member 11 at a predetermined distance from the post member 11 in a plan view, and exposing the dry film 60 at a location where the circuit pattern 222 is not formed, a step of developing the dry film 60 to remove the dry film 61 at the exposed location, and a step of etching the first metal layer 22 at a location where the first metal layer 22 is uncovered by removing a portion of the dry film 60, thus removing a portion of the first metal layer 22.

In this case, in this step S103, the dry film 60 is first provided on the entire top surface of the bonding material in which the first substrate 10 and the second substrate 20a are bonded. Subsequently, the mask is used to expose the dry film 60 along the shape of the desired annular first metal layer 221 and the shape of the desired circuit pattern 222. At this time, the dry film 60 is annularly exposed to surround the periphery of the post member 11 at a predetermined distance from the post member 11 so that when a portion of the first metal layer 22 is etched, another portion of the first metal layer 22 surrounds the periphery of the post member 11 in a plan view. Further, the dry film 60 at a location where the circuit pattern 222 is not formed is exposed.

Subsequently, the dry film 60 is developed to remove the dry film 61 at the exposed location. Subsequently, the first metal layer 22 uncovered from the dry film 62 at a location other than the exposed location is etched and removed. Then, the dry film 62 at a location other than the exposed location is removed. As a result, the circuit board 100 in which the desired annular first metal layer 221 and the desired circuit pattern 222 are formed is manufactured.

In a step of removing the portion of the first metal layer 22, the portion of the first metal layer 22 is preferably removed so that a width of the first metal layer 221 surrounding the post member 11 is in a range from 50 μm to 100 μm. The width of the first metal layer 221 can be controlled by adjusting the range of exposure of the dry film 60.

Note that in the manufacturing method for the circuit board according to the embodiment, the plurality of circuit boards 100 are manufactured simultaneously, but may be individualized into each circuit board 100, or may be transitioned to the manufacturing method for the light emitting device 200 described later, as an assembly of the circuit boards 100.

For example, when a circuit pattern is formed in the substrate before bonding the copper plate and the wiring substrate, as in the conventional technique, the substrate is easily deformed during processing, and thus the accuracy of the circuit pattern may be negatively affected due to the change in position and shape of the circuit pattern, etc. Therefore, the desired dimensions and processing accuracy may not be obtained. In contrast, in the manufacturing method for the circuit board according to the embodiment, the circuit pattern 222 is formed after the first substrate 10 and the second substrate 20a are bonded to each other. Therefore, because the second substrate 20a is fixed to the first substrate 10, the accuracy of the circuit pattern 222 does not deteriorate when forming the circuit pattern 222.

Furthermore, in the manufacturing method for the circuit board according to the embodiment, in a plan view, the portion of the first metal layer 22 is removed so that the portion of the first metal layer 22 surrounds the periphery of the post member 11. Thus, the annular first metal layer 221 is formed. Therefore, when the circuit pattern 222 is formed, because the post member 11 is protected by the annular first metal layer 221, the post member 11 can be prevented from being eroded excessively due to etching, etc.

Thus, the manufacturing method for the circuit board according to the embodiment can manufacture the circuit board 100 with high dimensional accuracy.

Manufacturing Method for Light Emitting Device

Subsequently, an example of a manufacturing method for the light emitting device according to the embodiment will be described.

Figure 13:
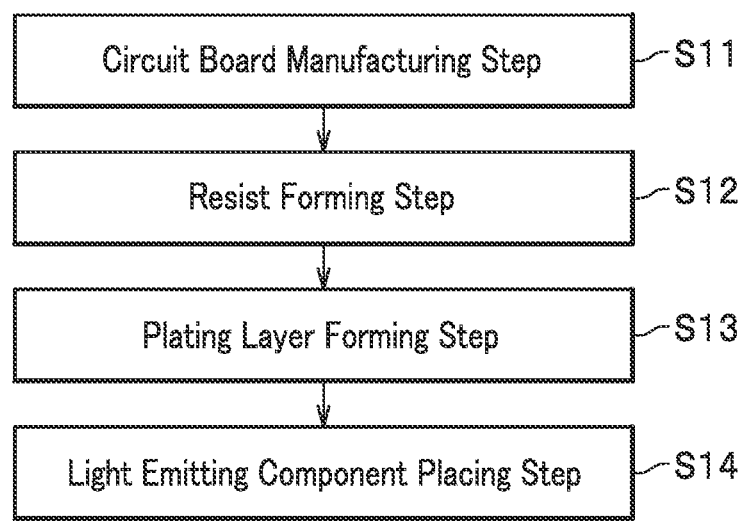
FIG. 13 is a flowchart illustrating the manufacturing method for a light emitting device according to the embodiment.
Figure 14A:
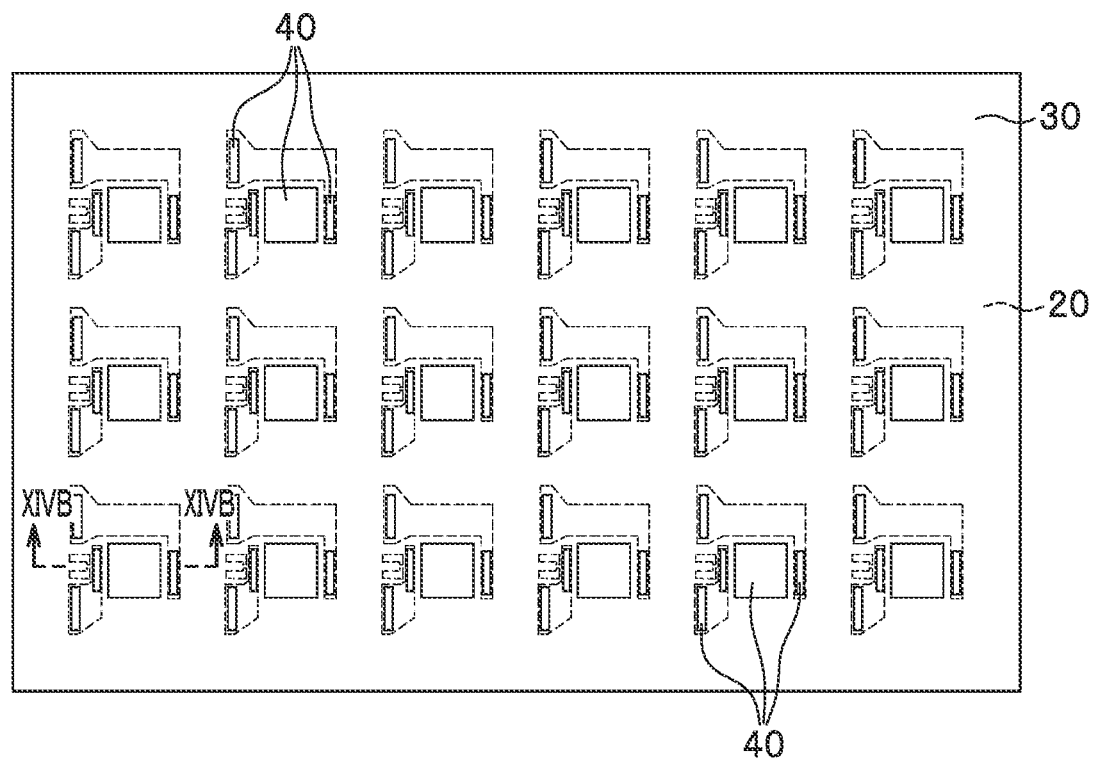
FIG. 14A is a plan view schematically illustrating a state in which a resist and a plating layer are formed in the manufacturing method for a light emitting device according to the embodiment.
Figure 14B:
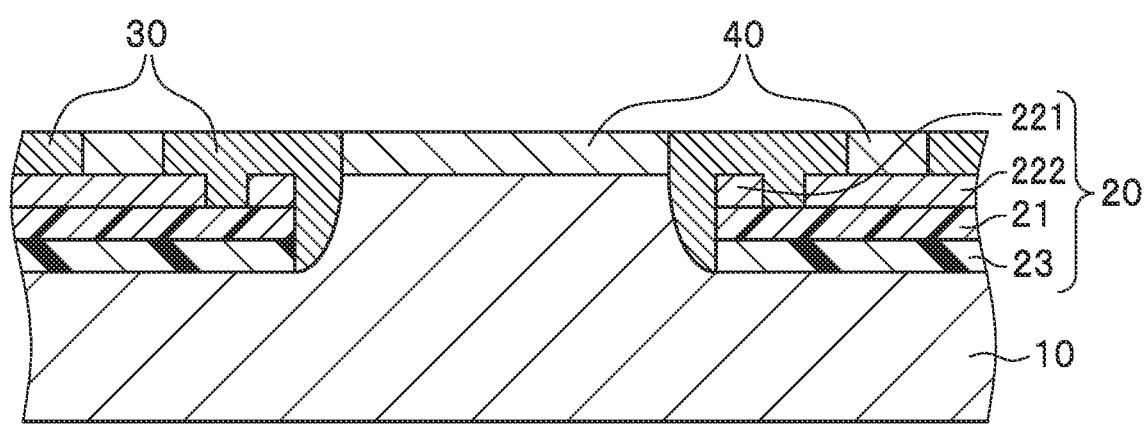
FIG. 14B is a schematic cross-sectional view taken along line XIVB-XIVB of FIG. 14A.
Figure 15A:
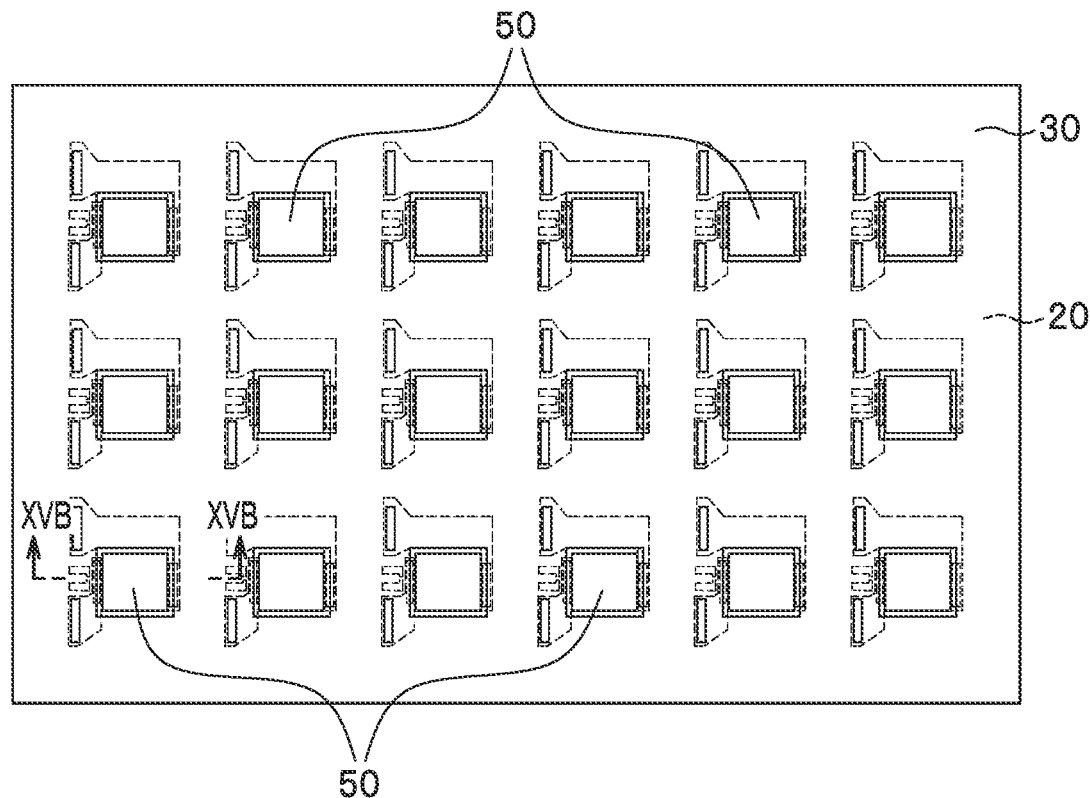
FIG. 15A is a plan view schematically illustrating a state in which a light emitting component is placed on the circuit board in the manufacturing method for a light emitting device according to the embodiment.
Figure 15B:
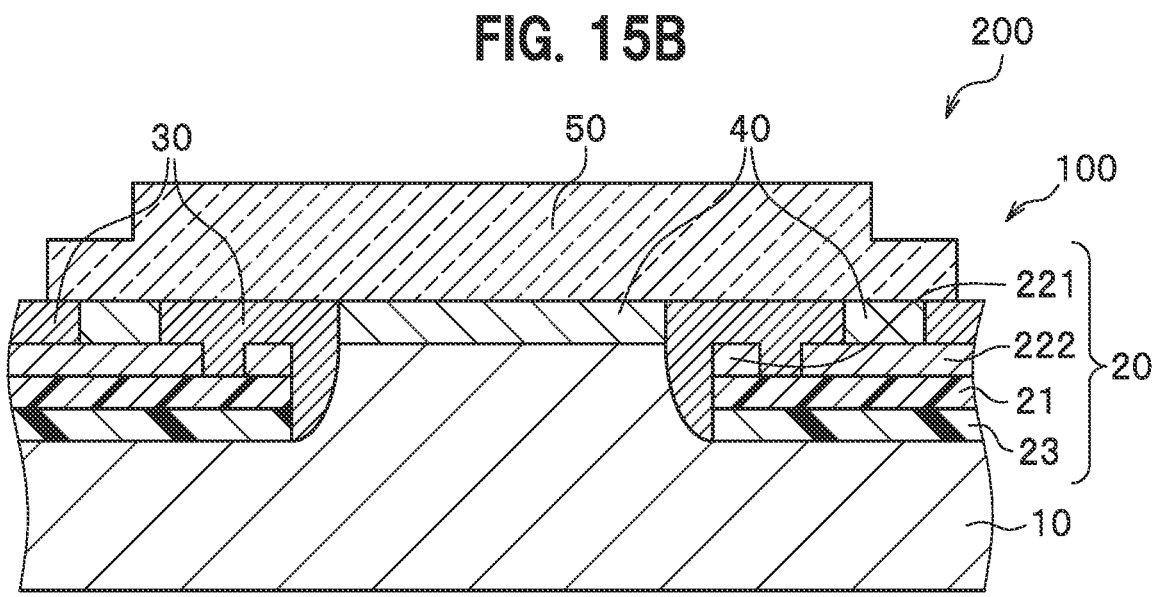
FIG. 15B is a schematic cross-sectional view taken along line XVB-XVB of FIG. 15A.

FIG. 13 is a flowchart illustrating the manufacturing method for a light emitting device according to the embodiment. FIG. 14A is a plan view schematically illustrating a state in which a resist and a plating layer are formed in the manufacturing method for a light emitting device according to the embodiment. FIG. 14B is a schematic cross-sectional view taken along line XIVB-XIVB of FIG. 14A. FIG. 15A is a plan view schematically illustrating a state in which a light emitting component is placed on the circuit board in the manufacturing method for a light emitting device according to the embodiment. FIG. 15B is a schematic cross-sectional view taken along line XVB-XVB of FIG. 15A.

Note that in the manufacturing method for the light emitting device according to the embodiment, a plurality of light emitting devices are manufactured simultaneously.

The manufacturing method for the light emitting device includes a step of manufacturing the circuit board 100 by the manufacturing method for the circuit board, and a step of placing the light emitting component 50 on the post member 11 of the circuit board 100.

Specifically, the manufacturing method for the light emitting device includes a circuit board manufacturing step S11, a resist forming step S12, a plating layer forming step S13, and a light emitting component placing step S14.

Note that the material, arrangement, or the like of each of the members are as in the description of the light emitting device 200, and thus descriptions thereof will be omitted as appropriate.

Circuit Board Manufacturing Step

The circuit board manufacturing step S11 is a step of manufacturing the circuit board 100 by the above-described circuit board manufacturing method.

In this step, the circuit board 100 is manufactured by performing the steps S101 to S103 described above.

Resist Forming Step

The resist forming step S12 is a step of forming the resist 30 on the top surface of the circuit board 100. The formation of the resist 30 can be performed by, for example, a screen printing method using a screen mask.

Plating Layer Forming Step

The plating layer forming step S13 is a step of forming the plating layer 40 on the top surface of the circuit board 100. The plating layer 40 can be formed by electroless plating or electrolytic plating.

Light Emitting Component Placing Step

The light emitting component placing step S14 is a step of placing the light emitting component 50 on the circuit board 100.

In step S14, for example, the light emitting component 50 is placed on the post member 11 of the circuit board 100 and on the plating layer 40 and the resist 30 around the post member 11 using an adhesive member such as solder paste.

In this manner, an assembly of the light emitting devices 200 is manufactured. The assembly is then individualized into each light emitting device 200 to obtain a plurality of the light emitting devices 200.

Although the embodiments for carrying out the invention have been described above in more detail, the gist of the present invention is not limited to these descriptions, and must be broadly interpreted based on the description of the scope of claims. Various modifications, variations, and the like based on these descriptions are also included within the spirit of the present invention.

Hereinafter, modification examples and application examples will be described. Note that the material, arrangement, or the like of each of the members are as in the description of the embodiment, and thus descriptions thereof will be omitted as appropriate.

MODIFICATION EXAMPLES

Modification Example 1

Figure 16A:
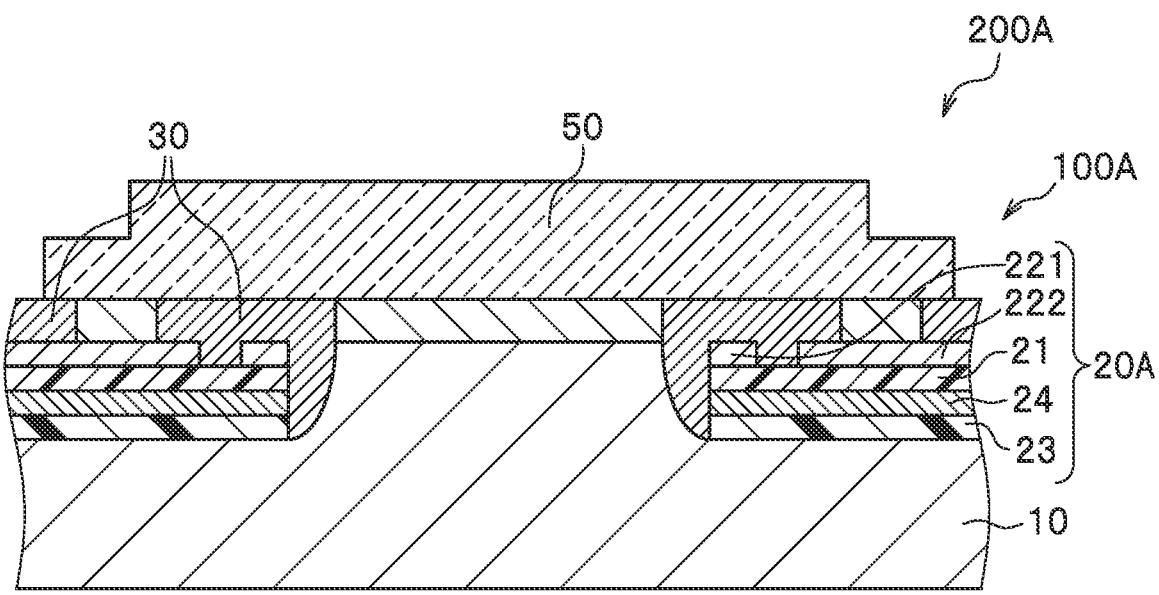
FIG. 16A is a cross-sectional view schematically illustrating an example of a light emitting device according to Modification Example 1.

FIG. 16A is a cross-sectional view schematically illustrating an example of a light emitting device according to Modification Example 1.

In a circuit board 100A and a light emitting device 200A, a second substrate 20A includes a second metal layer 24.

The first metal layer 221 and the circuit pattern 222 are provided on the base material 21 of the second substrate 20A, and the second metal layer 24 is provided on the opposite side to the first metal layer 221 and the circuit pattern 222 provided on the base material 21. The circuit board 100A and the light emitting device 200A can improve heat dissipation due to the second substrate 20A including the second metal layer 24. As the material of the second metal layer 24, for example, those exemplified for the first metal layer 221 and the circuit pattern 222 can be used.

Further, in the manufacturing method according to Modification Example 1, in the step of preparing the substrate, the first metal layer 22 is provided on the base material 21 of the second substrate 20A, and the second metal layer 24 is provided on the side opposite to the first metal layer 22 provided on the base material 21.

The second substrate 20A can be prepared, for example, by using a commercially available double-sided copper-clad layered plate. Alternatively, the second metal layer 24 may be joined to one surface of the commercially available single-sided copper-clad layered plate in which the first metal layer 22 is provided on the other surface. Alternatively, the first metal layer 22 may be provided on one surface of the base material 21, and the second metal layer 24 may be joined to the other surface of the base material 21 without using a commercially available single-sided copper-clad layered plate or double-sided copper-clad layered plate.

Modification Example 2

Figure 16B:
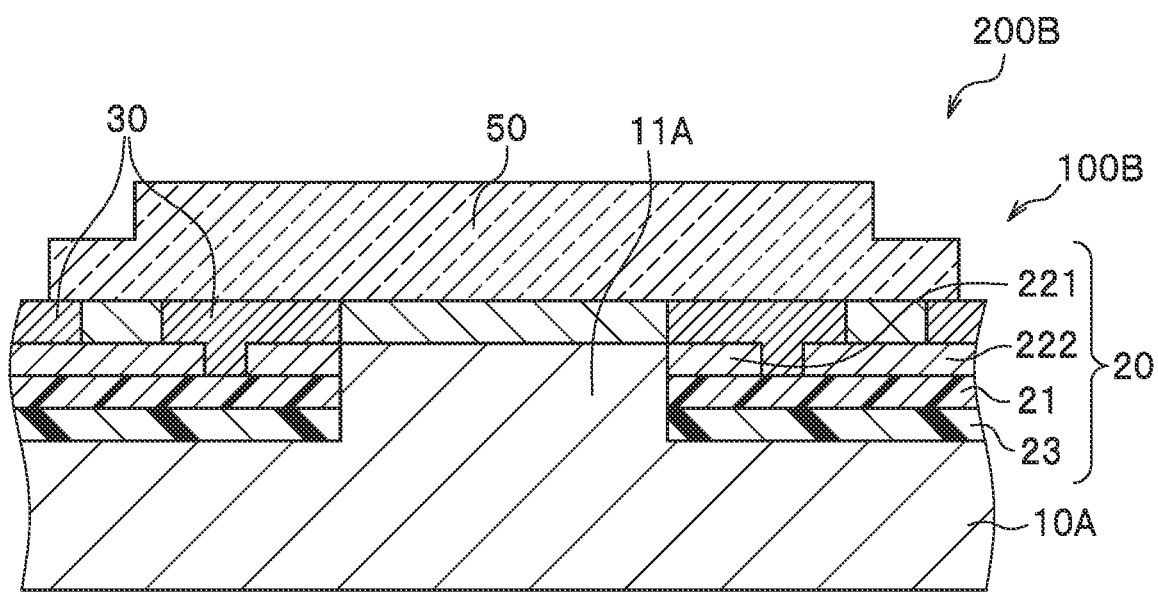
FIG. 16B is a cross-sectional view schematically illustrating an example of a light emitting device according to Modification Example 2.

FIG. 16B is a cross-sectional view schematically illustrating an example of a light emitting device according to Modification Example 2.

In the circuit board 100B and the light emitting device 200B, the first metal layer 221 is in direct contact with the periphery of the post member. In the first substrate 10A, a side surface of the post member 11A has a linear shape, and the post member 11A has a rectangular shape in a cross-sectional view. In the first substrate 10A, the base material 21, the first metal layer 221, and the bonding sheet 23 are in direct contact with the side surface of the post member 11A. According to such a configuration, the adhesion between the first substrate 10A and the second substrate 20 can be improved.

In addition, for example, the plating layer may be provided only in a portion or may not be provided. In the portion where the plating layer is not provided, the first substrate, the annular first metal layer, and the circuit pattern may be uncovered. Further, as described below, the top surface of the post member may have a long resist.

In addition, the manufacturing method for the circuit board may include other steps between, before, or after the steps described above within a range that does not adversely affect the steps described above. For example, a step of removing foreign matter mixed during manufacturing can be included.

Further, as long as the above-described steps are not adversely affected, the method of manufacturing the light emitting device can include another step during, before, or after any of the steps. For example, a step of removing foreign matter mixed during manufacturing can be included.

Application Example

Subsequently, an example of application of a circuit board and a light emitting device using a semiconductor laser element will be described. Note that, as an example of the application example, the configuration of the circuit board and the light emitting device is slightly different from the embodiment described above. In this manner, the circuit board and the light emitting device of the embodiment can be applied to various forms.

Figure 17A:
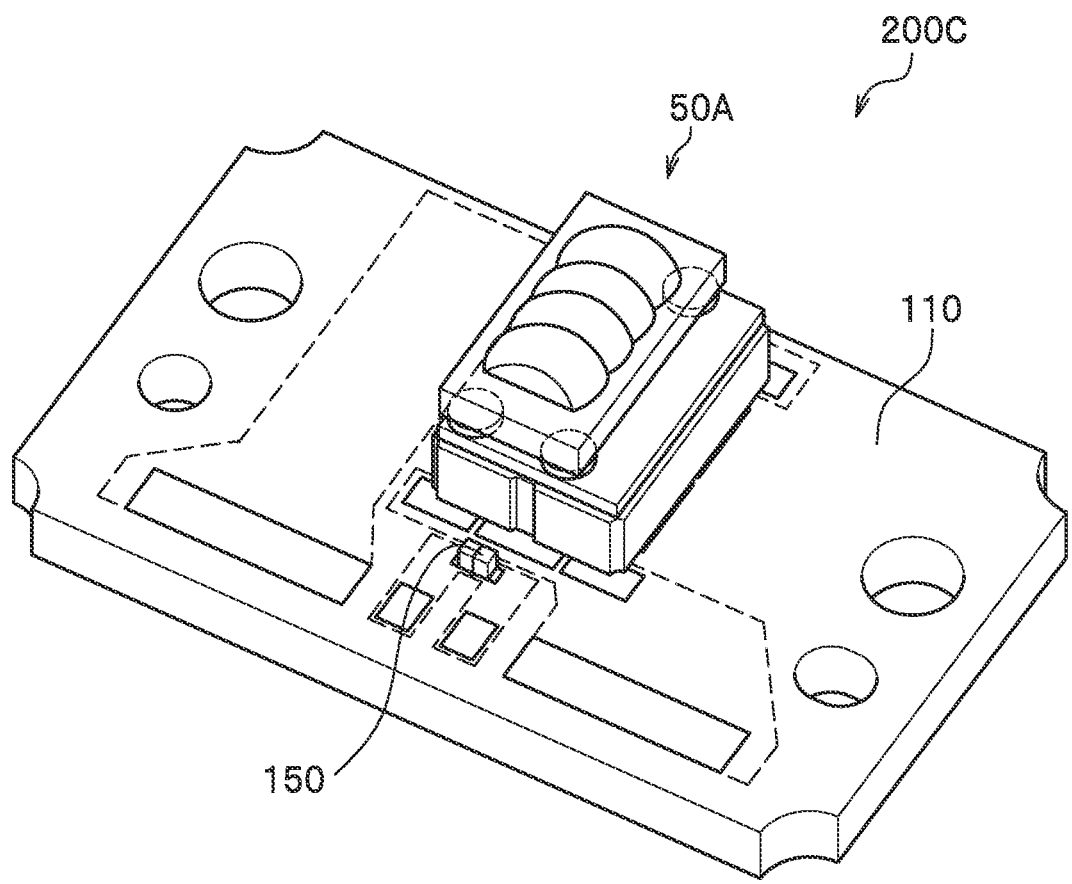
FIG. 17A is a perspective view schematically illustrating an example of a light emitting device according to an application example.
Figure 17B:
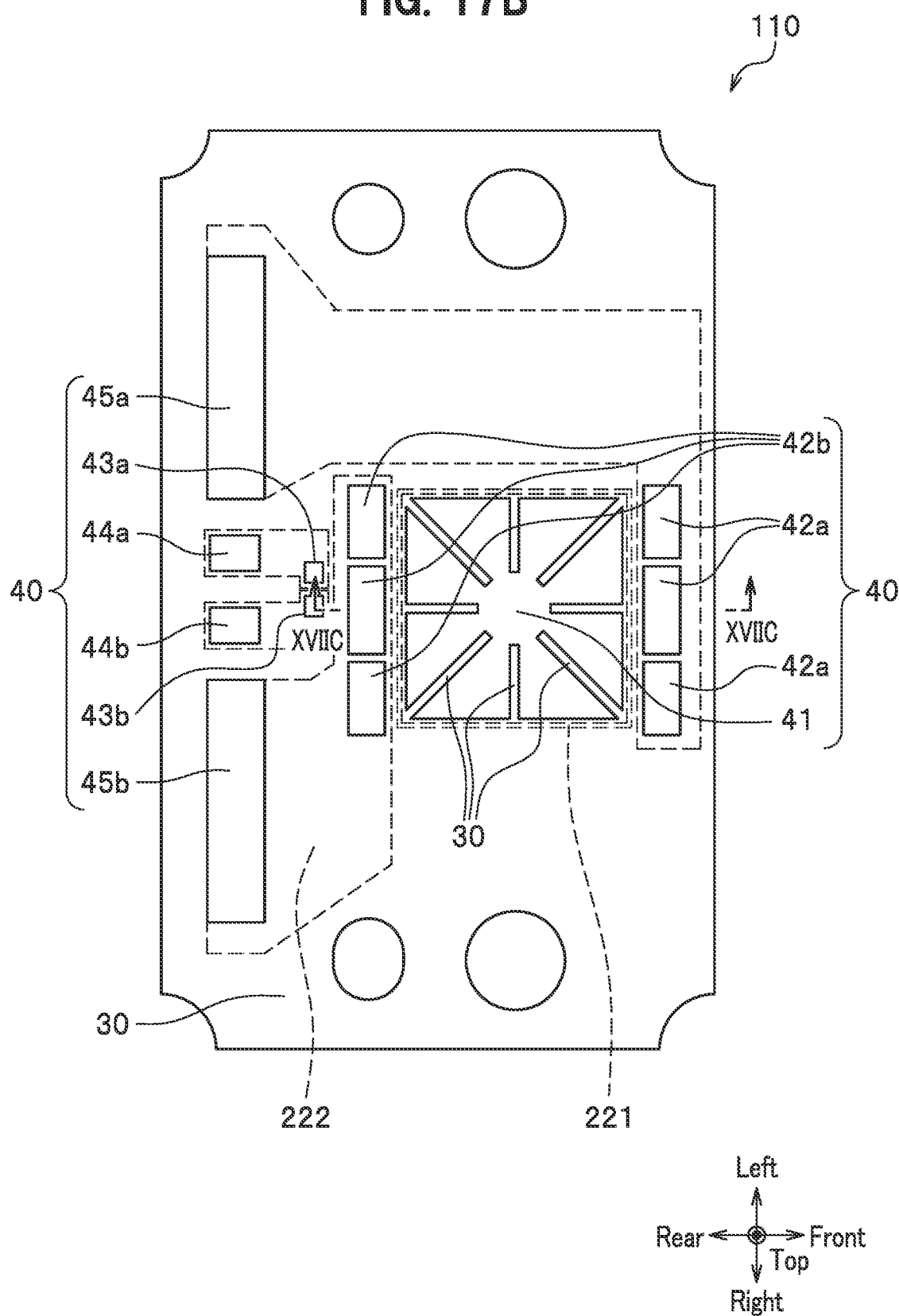
FIG. 17B is a plan view schematically illustrating an example of a configuration of a wiring substrate of the light emitting device according to the application example.
Figure 17C:
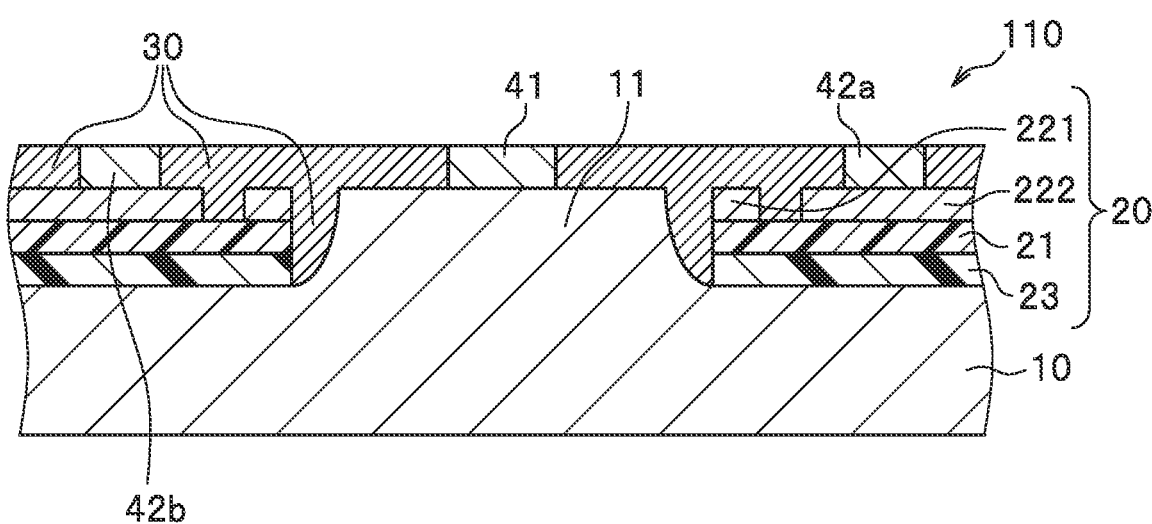
FIG. 17C is a schematic cross-sectional view taken along line XVIIC-XVIIC of FIG. 17B.
Figure 18A:
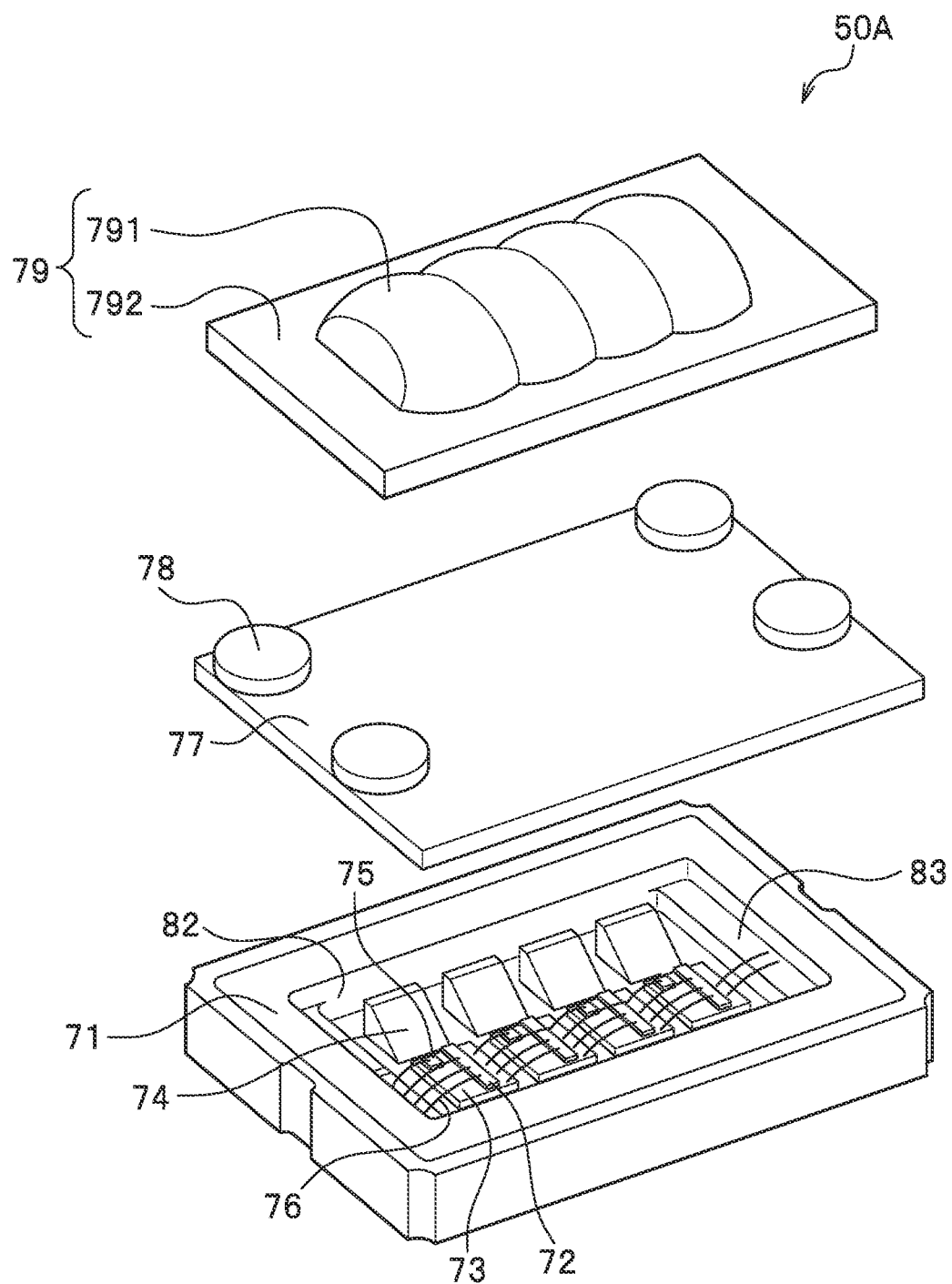
FIG. 18A is an exploded perspective view schematically illustrating an example of a configuration of the light emitting component.
Figure 18B:
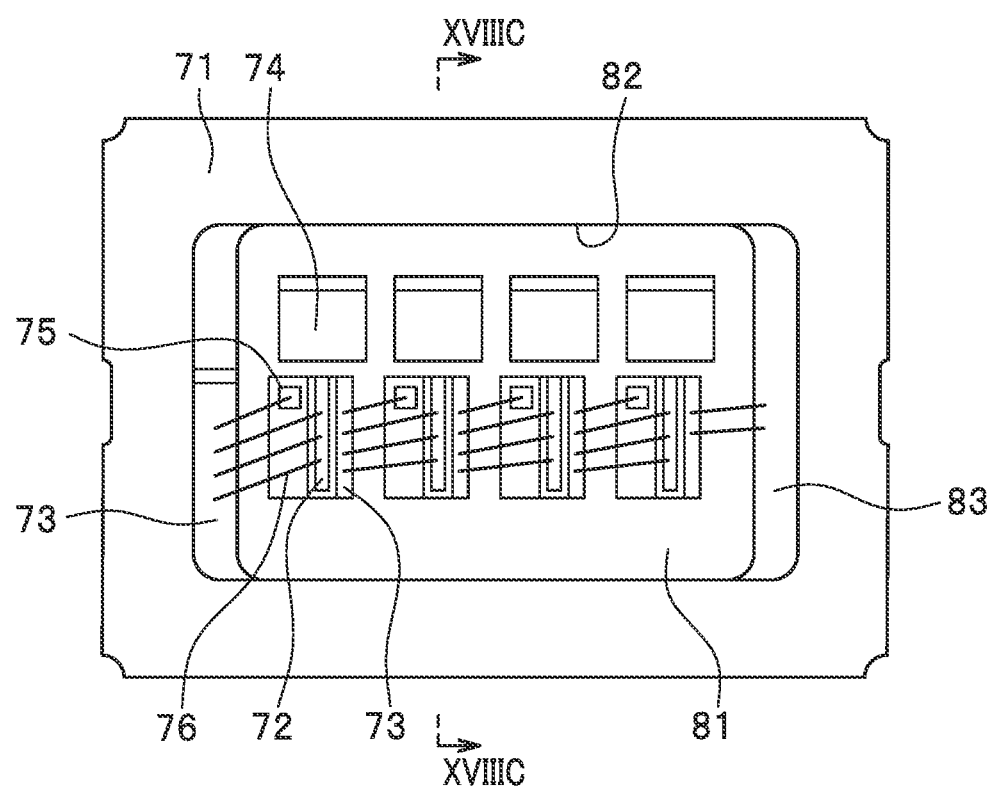
FIG. 18B is a plan view schematically illustrating a configuration in a package of the light emitting component.

FIG. 17A is a perspective view schematically illustrating an example of a light emitting device according to an application example. FIG. 17B is a plan view schematically illustrating an example of a configuration of a wiring substrate of the light emitting device according to the application example. FIG. 17C is a schematic cross-sectional view taken along line XVIIC-XVIIC of FIG. 17B. FIG. 18A is an exploded perspective view schematically illustrating an example of a configuration of the light emitting component. FIG. 18B is a plan view schematically illustrating a configuration in a package of the light emitting component. FIG. 18C is a schematic cross-sectional view taken along line XVIIIC-XVIIIC of FIG. 18B. FIG. 18D is a bottom view schematically illustrating a configuration of a bottom surface of the light emitting component.

A light emitting device 200C includes at least a wiring substrate 110, a light emitting component 50A, and a thermistor 150.

The wiring substrate 110 includes at least the resist 30 and the plating layer 40 on the top surface. The plating layer 40 includes a plating layer 41, plating layers 42a, 42b, plating layers 43a, 43b, plating layers 44a, 44b, and plating layers 45a, 45b. Also, the wiring substrate 110 includes the first metal layer 221 and the circuit pattern 222 under the resist 30 and the plating layer 40.

The plating layer 41 is a plating layer in a central region on which the light emitting component 50A is placed. The plating layers 42a are plating layers in a front region on which the light emitting component 50A is placed. The plating layers 42b are plating layers in a rear region on which the light emitting component 50A is placed. The plating layers 43a, 43b are plating layers of regions where the thermistor 150 is placed. The plating layers 44a, 44b are plating layers in a predetermined region for a thermistor inspection terminal. The plating layers 45a, 45b are plating layers in a predetermined region for a laser element inspection terminal.

The plating layer 41 and the plating layers 42a, 42b are portions where the light emitting component 50A is placed. The plating layers 43a and 43b are portions where the thermistor 150 is placed. In a portion of the plating layer 41, in a region formed in a rectangular shape along the outer edge of the first metal layer 221 in a plan view, a plurality of elongated resists 30 extend from the periphery of the rectangular shape toward the center. The plating layer 41 is a portion where the resists 30 are not disposed in the region formed in the rectangular shape. In the light emitting device, when the light emitting component is placed on the post member, air bubbles may remain between the post member and the light emitting component. In the light emitting device 200C, because the wiring substrate 110 includes the plurality of elongated resists 30 on the top surface of the post member 11, the air bubbles can be easily dispersed via the elongated resists 30. This improves the heat dissipation of the wiring substrate 110.

The resists 30 are provided on the top surface of the wiring substrate 110 excluding the plating layer 40. Three plating layers 42a are provided on the front side of the plating layer 41 in a plan view. Three plating layers 42b are provided on the rear side of the plating layer 41 in a plan view. The plating layers 42a, 42b paired on the front and rear sides with the plating layer 41 interposed therebetween are joined to a metal films 87 provided on the lower surface of the light emitting component 50A, thereby being electrically connected from one to the other.

The plating layers 42a and the plating layer 45a are electrically connected via the circuit pattern 222. The plating layers 42b and the plating layer 45b are electrically connected via the circuit pattern 222. The plating layers 45a, 45b function as laser element inspection terminals. The plating layer 43a and the plating layer 44a are electrically connected via the circuit pattern 222. The plating layer 43b and the plating layer 44b are electrically connected via the circuit pattern 222. The plating layers 44a, 44b function as thermistor inspection terminals.

The thermistor 150 is an example of a temperature detecting element used for measuring the temperature when the light emitting device 200C is operating. The thermistor 150 is placed in a state of being connected to the plating layer 43a and the plating layer 43b, thereby enabling conduction from the plating layer 43a to the plating layer 43b through the thermistor 150.

The light emitting component 50A includes a package 71, a semiconductor laser element 72, a submount 73, a light reflecting member 74, a protecting element 75, wires 76, a lid member 77, an adhesive member 78, and a lens member 79.

The package 71 has a rectangular recessed member 80 in a plan view. Here, the rectangular shape includes a substantially rectangular shape such as a shape in which a corner portion or a portion of a side surface is cut out like the package 71 or a shape in which a corner portion is curved like the recessed member 80. Additionally, in the package 71, stepped members 83 are formed on two inner side surfaces 82 in the lateral direction facing each other among the four inner side surfaces 82 of the recessed member 80. The package 71 may be formed using ceramic as a main material. Note that the package 71 may be formed of metal not limited to ceramic. For example, in the case of ceramics, aluminum nitride, silicon nitride, aluminum oxide, or silicon carbide can be used as the main material of the package 71. The main material of the package 71 may be copper, aluminum, or iron as a metal, or copper molybdenum, copper-diamond composite material, or copper tungsten as a composite.

A metal film is provided on each of the bottom surface 84 of the package 71 and the top surfaces of the stepped members 83. The metal film on the bottom surface 84 of the package 71 includes metal films 87 paired at both ends of the package 71, and a metal film 88 provided at the center of the bottom surface 84 of the package 71 between both ends of the metal films 87. Each of the metal films 87 is separated from each other at three locations along each of two sides facing each other. The metal films 87 are formed facing each other so that the plating layers 42a, 42b of the wiring substrate 110 can be connected. The metal film 88 can be connected to the plating layer 41 of the wiring substrate 110. In the package 71, the metal film on the top surfaces of the stepped members 83 and the metal films 87 on the bottom surface 84 are electrically connected to each other by the metal wiring passing therethrough.

The semiconductor laser element 72 and the protecting element 75 are electrically connected to the connecting wiring line, which is a metal film provided on the top surfaces of the stepped members 83. The wires 76 are joined for this conduction. Thus, the semiconductor laser element 72 and the protecting element 75 are electrically connected via the metal films 87 provided on the bottom surface 84 of the package 71.

In such a light emitting component 50A, the pair of metal films 87 provided on the lower surface 84 of the package 71 are joined to the plating layers 42a, 42b of the wiring substrate 110. Further, the metal film 88 provided at the center of the bottom surface 84 of the package 71 is joined to the plating layer 41 of the wiring substrate 110. The joining between the light emitting component 50A and the wiring substrate 110 can be performed by soldering.

The semiconductor laser element 72 is placed on a bottom surface 81 (top surface of a bottom portion 86) of the recessed member 80 of the package 71 via the submount 73. A plurality of the semiconductor laser elements 72 placed on the light emitting component 50A are disposed side-by-side in one direction, specifically in the longitudinal direction of the package 71. In addition, the directions of the emission end surfaces are aligned so that the semiconductor laser elements 72 to be placed emit laser beams in the same direction. The plurality of semiconductor laser elements 72 disposed in one direction are electrically connected in series with the wires 76.

The submount 73 is joined to the bottom surface 81 of the recessed member 80 of the package 71 on the bottom surface of the submount 73 by an adhesive member such as Au paste, and is joined to the semiconductor laser element 72 on the top surface of the submount 73. The submount 73 can be formed using, for example, silicon nitride, aluminum nitride, or silicon carbide. A metal film such as Cu plating is provided on the top surface of the submount 73.

The light reflecting member 74 is a member that reflects light from the semiconductor laser element 72. The light reflecting member 74 is joined to the bottom surface 81 of the recessed member 80 of the package 71 by the adhesive member on the bottom surface of the light reflecting member 74. The adhesive member is formed by fusing particles of Ag, Au, Cu, etc., after application of a mixture of particles of Ag, Au, Cu, etc. and an organic solvent, and then removal of the organic solvent by heating. The light reflecting members 74 independently correspond to the respective semiconductor laser elements 72. The light reflecting member 74 has a bottom surface, a top surface, a side surface, and an inclined surface, and the inclined surface forms a light reflecting surface. The light reflecting surface is a flat surface, and is inclined from the top surface to the bottom surface.

The light reflecting member 74 can be formed by forming an outer shape using the main material and forming a light reflecting film on a surface of the formed outer shape on which a light reflecting surface is desired to be provided. As the main material, a heat-resistant material is preferable, and for example, glass such as quartz or BK7 (borosilicate glass), a metal such as aluminum, Si, etc. can be employed. The light reflecting film is preferably made of a material having high light reflectance, and metals such as Ag and Al, dielectric multilayer films such as $Ta_2O_5/SiO_2$, $TiO_2/SiO_2$, and $Nb_2O_5/SiO_2$ can be employed. Note that when the outer shape of the light reflecting member 74 is formed using a material having high light reflectance such as metal as a main material, the formation of the light reflecting film may be omitted.

The light reflecting surface of the corresponding light reflecting member 74 is irradiated with the main part of the light emitted from the semiconductor laser element 72. Note that the light emitting component may be a light emitting component in which the light reflecting member 74 is not provided and the emission end surface of the semiconductor laser element 72 faces upward.

The protecting element 75 is placed on the top surface of the submount 73. The protecting element 75 is a Zener diode, for example. The wires 76 are wiring of metal. Examples of the material of the wires 76 include metals such as Au, Ag, Cu, Pt, and Al, and alloys thereof. Note that the light emitting component may not include the protecting element 75.

The lid member 77 is a member that covers the semiconductor laser element 72 and the light reflecting member 74. The lid member 77 is entirely transparent, but may partially have a non-light-transmissive region. The lid member 77 can be formed using sapphire as a main material. The lid member 77 is provided with a metal film in some regions. In addition to sapphire, for example, glass, etc. can be used as a main material.

The lid member 77 is joined to the top surface of the package 71 (the top surface of the frame member 85) on the bottom surface of the lid member 77. The lid member 77 and the package 71 are provided with a metal film in the region to be joined, and are fixed via Au—Sn, etc. In the light emitting component 50A, a closed space is formed by joining the package 71 and the lid member 77. This closed space is an air-tightly sealed space. By hermetically sealing the light emitting component 50A in this manner, dust such as organic matter can be suppressed from being collected on the emission end surface of the semiconductor laser element 72.

The adhesive member 78 is formed in a region where the lid member 77 and the lens member 79 are adhered on the top surface of the lid member 77. As the adhesive member 78, for example, an ultraviolet curable resin can be used.

The lens member 79 is facing the top surface of the lid member 77. The lens member 79 is formed integrally with lens portions 791 having lens shapes and a rectangular support plate member 792 that supports the lens portions 791. In the lens member 79, each of the lens portions 791 is provided at a position facing the optical axis of the semiconductor laser element 72. The arrangement and shape of each lens portion 791 are designed such that reflected light emitted from the corresponding semiconductor laser element 72 and reflected by the light reflecting member 74 passes through the lens portion 791 and is collimated. For example, glass such as BK7, B270, etc. can be used in the lens member 79.

The circuit board and the light emitting device according to the embodiment of the present disclosure can be used for various electronic devices.

What is claimed is:

1. A method for manufacturing a circuit board, the method comprising:
   preparing a first substrate and a second substrate, wherein:
   the first substrate comprises a convex post member formed at a top surface of the first substrate, and
   the second substrate includes a first surface and a second surface opposite to the first surface, and comprises:
   a first metal layer formed on at least the first surface, and
   an opening through which a top surface of the post member is uncovered in a plan view;
   bonding at least a portion of a top surface of the first substrate excluding the post member and the second surface of the second substrate so that the top surface of the post member is uncovered through the opening; and
   forming a circuit pattern by removing a first portion of the first metal layer: wherein:
   in the step of forming the circuit pattern, the first portion of the first metal layer is removed such that a second portion of the first metal layer continuously annularly surrounds a periphery of the post member in a plan view, and such that a width of the first metal layer surrounding the post member is in a range from 50 μm to 100 μm.

2. The manufacturing method for the circuit board according to claim 1, wherein:
   the step of forming of the circuit pattern comprises:
   providing a dry film on the post member and the first metal layer,
   exposing the dry film from a position of the post member to a position where the dry film is in contact with the first metal layer around the post member in a plan view, and exposing the dry film at a location where the circuit pattern is to be formed,
   developing the dry film to remove the dry film at a location other than the exposed location, and
   etching the first metal layer at a location where the first metal layer is uncovered by removing a portion of the dry film, thus removing the first portion of the first metal layer.

3. The manufacturing method for the circuit board according to claim 1, wherein:
   the step of forming the circuit pattern comprises:
   providing a dry film on the post member and the first metal layer,
   exposing the dry film annularly to surround a periphery of the post member at a predetermined distance from the post member in a plan view, and exposing the dry film at a location where the circuit pattern is not formed;
   developing the dry film to remove the dry film at the exposed location, and
   etching the first metal layer at a location where the first metal layer is uncovered by removing a portion of the dry film, thus removing the first portion of the first metal layer.

4. The manufacturing method for the circuit board according to claim 1, wherein:
   in the step of bonding the first substrate and the second substrate, the first substrate and the second substrate are bonded so that the top surface of the post member and a top surface of the first metal layer are flush with each other.

5. The manufacturing method for the circuit board according to claim 1, wherein:
   in the step of preparing the first substrate and the second substrate:
   the first metal layer is provided on a base material of the second substrate,
   the base material is polyimide, and
   the first metal layer is made of a material including 90 mass % or more of copper.

6. The manufacturing method for the circuit board according to claim 1, wherein:
in the step of preparing the first substrate and the second substrate:
the first metal layer is provided on a base material of the second substrate,
the base material has a thickness in a range from 12 μm to 50 μm, and
the first metal layer has a thickness in a range from 12 μm to 70 μm.

7. The manufacturing method for the circuit board according to claim 1, wherein:
in the step of preparing the first substrate and the second substrate:
the first metal layer is provided on a base material of the second substrate, and
a second metal layer is provided on a side opposite to the first metal layer provided on the base material.

8. The manufacturing method for the circuit board according to claim 1, wherein:
in the step of preparing the first substrate and the second substrate, the first substrate is made of a material including 90 mass % or more of copper.

9. The manufacturing method for the circuit board according to claim 1, wherein:
in the step of preparing the first substrate and the second substrate, a height from the top surface of the first substrate excluding the post member to the top surface of the post member is in a range from 50 μm to 150 μm.

10. A manufacturing method for a light emitting device, the method comprising:
manufacturing a circuit board by the method according to claim 1; and
placing a light emitting component on the post member of the circuit board.

11. A circuit board comprising:
a first substrate comprising a convex post member formed at a top surface of the first substrate; and
a second substrate including a first surface and a second surface opposite to the first surface, and comprising:
a first metal layer formed on at least the first surface, wherein the first metal layer continuously annularly surrounds a periphery of the post member in a plan view, and wherein a width of the first metal layer is in a range from 50 μm to 100 μm,
a circuit pattern made of the same material as the first metal layer, and
an opening through which a top surface of the post member is uncovered in a plan view; wherein:
at least a portion of the top surface of the first substrate excluding the post member faces the second surface.

12. The circuit board according to claim 11, wherein:
the first metal layer and the circuit pattern are separated from each other in a plan view.

13. The circuit board according to claim 11, wherein:
the first metal layer and the circuit pattern have the same thickness.

14. The circuit board according to claim 11, wherein:
the top surface of the post member, a top surface of the first metal layer, and a top surface of the circuit pattern are flush with each other.

15. The circuit board according to claim 11, wherein:
the second substrate includes a base material, and the first metal layer and the circuit pattern are disposed on the base material,
the base material is polyimide, and
the first metal layer and the circuit pattern are made of a material including 90 mass % or more of copper.

16. The circuit board according to claim 11, wherein:
the second substrate includes a base material, and the first metal layer and the circuit pattern are disposed on the base material,
the base material has a thickness in a range from 12 μm to 50 μm, and
the first metal layer and the circuit pattern have a thickness in a range from 12 μm to 70 μm.

17. The circuit board according to claim 11, wherein:
the first metal layer and the circuit pattern are provided on a base material of the second substrate, and
a second metal layer is provided on a side opposite to the first metal layer and the circuit pattern provided on the base material.

18. The circuit board according to claim 11, wherein:
the first substrate is made of a material including 90 mass % or more of copper.

19. The circuit board according to claim 11, wherein:
a height from the top surface of the first substrate excluding the post member to the top surface of the post member is in a range from 50 μm to 150 μm.

20. A light emitting device comprising:
the circuit board according to a claim 11; and
a light emitting component located on the post member of the circuit board.

21. A method for manufacturing a circuit board, the method comprising:
preparing a first substrate and a second substrate, wherein:
the first substrate comprises a convex post member formed at a top surface of the first substrate, and
the second substrate includes a first surface and a second surface opposite to the first surface, and comprises:
a first metal layer formed on at least the first surface, and
an opening through which a top surface of the post member is uncovered in a plan view;
bonding at least a portion of a top surface of the first substrate excluding the post member and the second surface of the second substrate so that the top surface of the post member is uncovered through the opening and so that the top surface of the post member and a top surface of the first metal layer are flush with each other; and
forming a circuit pattern by removing a first portion of the first metal layer: wherein:
in the step of forming the circuit pattern, the first portion of the first metal layer is removed such that a second portion of the first metal layer continuously annularly surrounds a periphery of the post member in a plan view.

22. A circuit board comprising:
a first substrate comprising a convex post member formed at a top surface of the first substrate; and
a second substrate including a first surface and a second surface opposite to the first surface, and comprising:
a first metal layer formed on at least the first surface, wherein the first metal layer continuously annularly surrounds a periphery of the post member in a plan view,
a circuit pattern made of the same material as the first metal layer, and
an opening through which a top surface of the post member is uncovered in a plan view; wherein:

at least a portion of the top surface of the first substrate excluding the post member faces the second surface, and the top surface of the post member, a top surface of the first metal layer, and a top surface of the circuit pattern are flush with each other.

* * * * *